United States Patent [19]

Ishikawa et al.

[11] Patent Number: 4,953,095
[45] Date of Patent: Aug. 28, 1990

[54] APPARATUS AND METHOD FOR MEASURING THE FREQUENCY OF A PULSE SIGNAL

[75] Inventors: Masahiro Ishikawa; Norio Fujiki; Yukio Hiramoto; Yoichiro Tanaka, all of Kanagawa, Japan

[73] Assignee: Nissan Motor Co., Ltd., Japan

[21] Appl. No.: 103,044

[22] Filed: Sep. 30, 1987

[30] Foreign Application Priority Data

| Sep. 30, 1986 | [JP] | Japan | 61-233492 |
| Oct. 28, 1986 | [JP] | Japan | 61-256348 |
| Nov. 21, 1986 | [JP] | Japan | 61-278367 |
| Jul. 13, 1987 | [JP] | Japan | 62-174329 |

[51] Int. Cl.$^5$ .................... G01R 23/02; G01P 1/07
[52] U.S. Cl. .................... 364/484; 324/78 D; 340/670; 377/20; 377/23; 377/28
[58] Field of Search .................... 364/484, 481; 377/20, 377/23, 28; 324/78 D; 340/658, 670

[56] References Cited

U.S. PATENT DOCUMENTS

| 4,051,434 | 9/1977 | Sweet | 324/78 D |
| 4,396,991 | 8/1983 | Baldwin et al. | 364/484 |
| 4,438,504 | 3/1984 | Favin | 364/484 |
| 4,544,884 | 10/1985 | Hayashi | 324/78 D |
| 4,595,992 | 6/1986 | Drogin | 364/484 |
| 4,609,990 | 9/1986 | Sember et al. | 364/484 |
| 4,669,098 | 5/1987 | Boatwright | 377/28 |
| 4,722,094 | 11/1988 | Goodzey | 377/23 |

Primary Examiner—Bruce Y. Arnold
Assistant Examiner—Terry S. Callaghan
Attorney, Agent, or Firm—Leydig, Voit & Mayer

[57] ABSTRACT

An apparatus for measuring the frequency of a pulse train signal and method therefor applicable to a speedometer of a vehicle are disclosed in which a count value C of at least one counter which counts number of pulses in the pulse train signal for predetermined counting intervals of time $\Delta T$ ($=T/n$, wherein T denotes a frequency measuring time interval and n denotes a calculation constant) is updated to a value related to the count value for each predetermined counting interval of time $\Delta T$ and stored and outputted for each predetermined counting interval of time $\Delta T$ so that the same or better performance as that using a stagger ring method can be achieved. The value is expressed by $(C - C/\alpha)$ in a first preferred embodiment (wherein $\alpha$ denotes the calculation constant preferably equal to n), by $(C - C \times m/\alpha + D)$ in a second preferred embodiment (wherein m denotes the number of counters and D denotes the latest count values of the m counters during $\Delta T$ at the time of update), by $(C - M_1 \times C/\alpha + M_2 D)$ in a third preferred embodiment (wherein $M_1$ and $M_2$ denotes values determined according to a change rate of the count value C of the counter with respect to time and D denotes the latest count value of the counter for $\Delta T$ at the time of update), and by $(C - C/M)$ in a fourth preferred embodiment (wherein M denotes a value determined according to a change rate of the count value C of the counter with respect to time).

43 Claims, 15 Drawing Sheets

FIG.17(a) SWITCHING SIGNAL CLK 1

FIG.17(b) VEHICLE SPEED PULSE

FIG.17(c) FREQUENCY DIVISION RATIO CONTROL SIGNAL

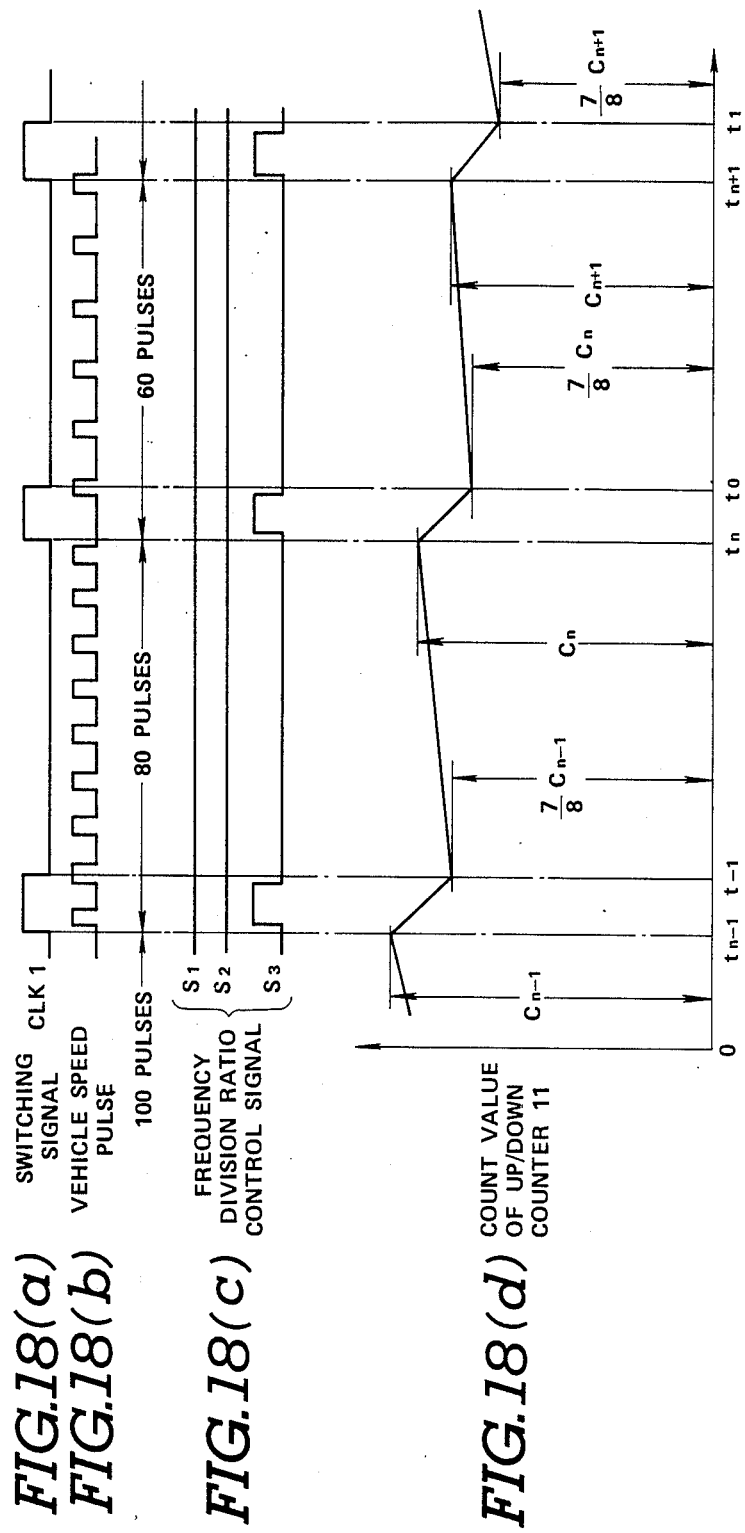
FIG.18(a) SWITCHING SIGNAL CLK 1
FIG.18(b) VEHICLE SPEED PULSE
FIG.18(c) FREQUENCY DIVISION RATIO CONTROL SIGNAL {S1, S2, S3}
FIG.18(d) COUNT VALUE OF UP/DOWN COUNTER 11

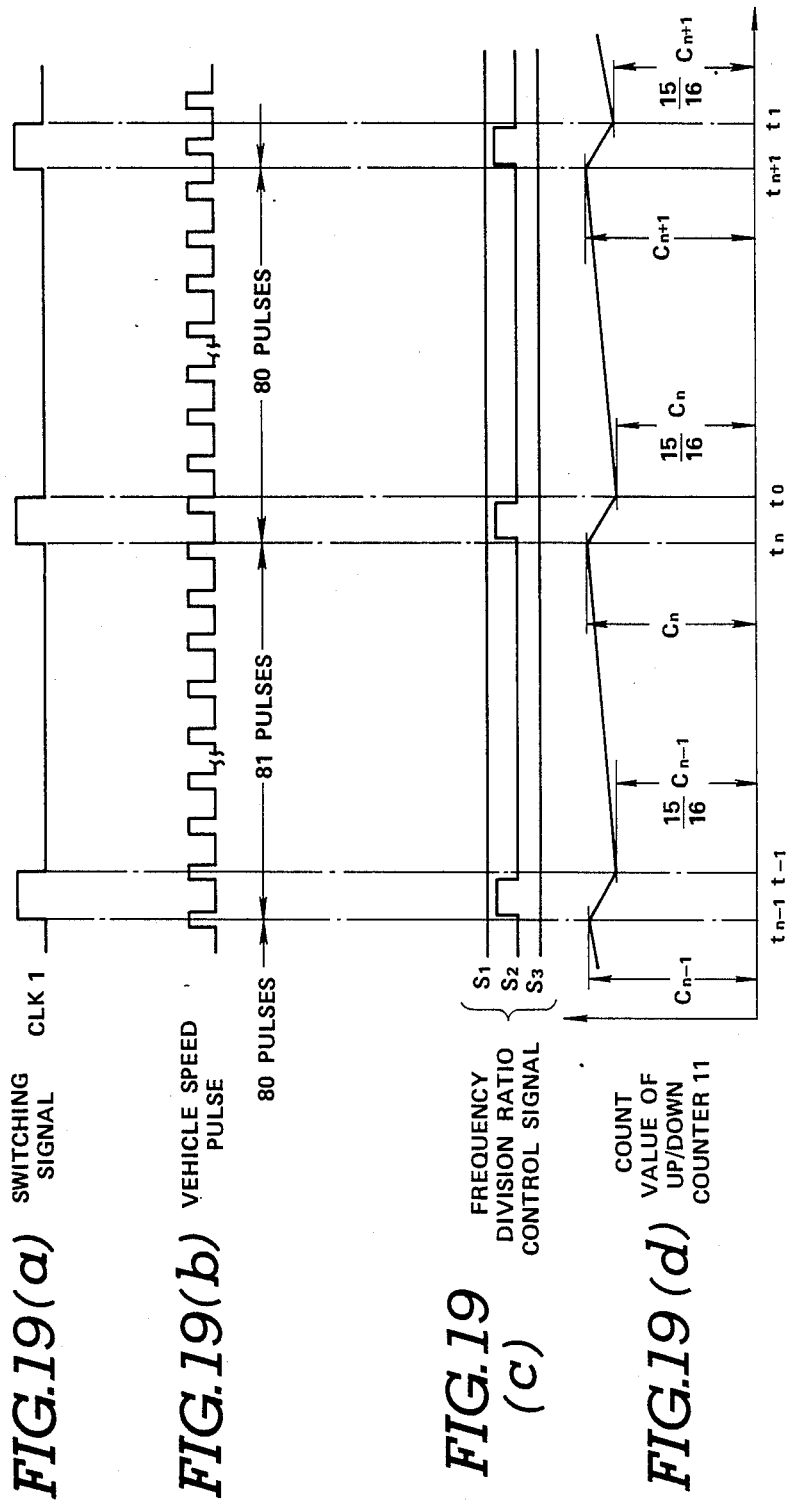

APPARATUS AND METHOD FOR MEASURING THE FREQUENCY OF A PULSE SIGNAL

BACKGROUND OF THE INVENTION

The present invention relates to an apparatus and method for measuring the frequency of a pulse signal.

A Japanese publication "Patent Pulse Circuitry Technological Dictionary" (Tokkyo Pulse Kairo Gijyutsu Jiten) published on May 20, 1980 by Kabushiki Kaisha Ohm sha and edited by Yasuo Suzuki and Takehisa Higuchi (Page 520) exemplifies one of such pulse signal frequency measuring apparatus.

The pulse signal frequency measuring apparatus disclosed in the above-identified Japanese publication document includes a counter, an output register, and a timing controller.

The counter counts the input number of pulses within a predetermined counting interval of time. The counting interval of time is prescribed by means of the timing controller. In addition, the counting interval of time is set to a time interval required for a determined frequency measurement accuracy. The result of counting by the counter is latched and outputted in the output register at a time when the timing controller outputs a latch signal to the output register. At the same time, the timing controller outputs a reset signal to the counter to reset the counter. That is to say, the counting result Cn, i.e., the number of pulses counted during the predetermined counting time interval $T_n$, is outputted from the output register while the counter counts the number of pulses during the next counting time interval, i.e., the time $T_{n+1}$. In this way, the output contents of the output register is updated for each counting interval of time $T (=T_n=T_{n+1}=T_{n+2}...)$. An interval for which the contents of the output register is updated, i.e., an output refreshing interval, is the counting interval of time T required to determine the frequency measurement accuracy.

Therefore, in a case where the above-described pulse signal frequency measuring apparatus is applied to an apparatus for indicating a vehicle speed in an analog form (speedometer), the counter counts the number of pulses derived from a vehicle speed sensor and a pointer of the speedometer is swung through an angle according to the output contents of the output register.

However, since, in this case, a period of time for moving an indicated position of the pointer becomes long as the above-described output refreshing interval becomes long, the output contents of the output register cannot follow up a change in the vehicle speed when the vehicle speed abruptly changes. Consequently, an indicated value of the pointer of the speedometer changes stepwise and does not change smoothly making it difficult for a vehicle driver to recognize the vehicle speed.

Such a problem as described above will be described in detail below.

Suppose that a maximum speed indicated value of the speedometer is 180 Km/h, the angle through which the pointer swings to indicate 180 Km/h is 270 degrees, and a required speed resolution is 0.3 degrees. In this case, a full scale of the speedometer needs to be divided into 270/0.3 =900 to indicate the vehicle speed. In addition, suppose that a pulse repetition rate of a digital vehicle speed sensor is about 500 Hz at the maximum speed 180 Km/h.

In the above-specified vehicle speed indicating apparatus, the time required to count 900 pulses at the maximum speed of 180 Km/h is 900×1/500=1.8 seconds. If the above-described time of 1.8 seconds is set as the counting interval, 1.8 seconds is the output refreshing interval of time for the output register. Hence, since the indicated value of the pointer of the speedometer changes after a period of 1.8 seconds, so that the movement of the pointer becomes extremely jerky or intermittent.

It is noted that since a duty ratio of each pulse derived from the vehicle speed sensor is approximately 50%, the countable frequency from the vehicle speed sensor for the counter can be changed to 1000 Hz if the counter counts the number of pulses on each rising or trailing edge of the pulse signal from the vehicle speed sensor. However, in this case, the counting interval of time T, i.e., refreshing interval becomes 0.9 seconds and it is insufficient to eliminate intermittent movement of the pointer.

A change of the indicated value by the pointer having a period of about 0.1 seconds gives a general feeling that the pointer smoothly moves. However, if the output refreshing interval is merely shortened, the counting interval of time T becomes simultaneously short. Consequently, the number of pulses counted during the counting interval of time becomes less and a resolution of the indicating apparatus becomes reduced. In the above-described example, if the counting interval of time T is set to 0.1 seconds, the number of pulses countable within 0.1 seconds is reduced from 900 to 50 at 180 Km/h and the resolution is extremely reduced to 270/50=5.4 degrees (180/50=3.6 Km/h).

Next, another pulse signal frequency measuring apparatus using a so called staggar ring method will be described below.

In the staggar ring method, n counters need to be connected in parallel to one another if a frequency measuring interval of time required from its resolution is T and the output refreshing interval of time is T/n. In detail, if a count value of each counter counted at the time interval T/n which is the same as the output refreshing interval of time is expressed as $D_j$ (j=1 to n) and an output data from the output register at a certain time is expressed as $C_i$ (i=1 to n), the output count data $C_i$ can be derived as follows:

$$C_i = \sum_{j=i}^{n+i-1} D_j$$

Thus, the output data $C_i$ is outputted for each output refreshing interval T/n.

In other words, the old count value before (n+1) time is sequentially deleted and in place of (n+1) time count value the latest count value is added to the count value.

Hence, since the sum of the count values in n number of times is outputted after the lapse of the frequency measuring interval T, the count value $C_i$ for each refreshing interval T/n indicates a value proportional to the frequency of the measured pulse signal.

Although in the staggar ring method the data $C_i$ can be refreshed for each desired output refreshing interval, in general n=9 or nearly 9 and therefore the number of parallel counters is accordingly increased. In addition, a multiplexer to select sequentially the output data of the counters needs to be added. Consequently, the construction of the whole circuitry becomes large-sized and complicated.

SUMMARY OF THE INVENTION

It is, therefore, an object of the present invention to provide an improved apparatus and method for measuring the frequency of a pulse signal applicable to a vehicle speedometer, having a simple construction, and the same or better performance as that using the staggarring method.

It is another object of the present invention to provide the improved pulse signal frequency measuring apparatus which is accurate in the measured pulse signal frequency, has a highly responsive characteristic, and assures high resolution.

The above-described objects can be achieved by providing an apparatus for measuring the frequency of a pulse train signal, comprising: (a) first means for counting number of pulses of the pulse train signal for each predetermined counting interval of time and outputting a count value representing the counted number of pulses whenever the predetermined counting interval of time has elapsed; (b) second means for storing the count value outputted from the first means and outputting the stored count value whenever the predetermined counting interval has elapsed; (c) third means for controlling the counting of the first means whenever the predetermined counting interval has elasped so that the second means outputs a sum of the count values whenever the predetermined counting interval has elapsed; and (d) fourth means for eliminating a value corresponding to an error generated for a transition time from an end of a previous predetermined counting interval to a start of a present predetermined counting interval from the sum of the count values at the present predetermined counting interval, so that the second means outputs the count value according to the frequency of the pulse train signal whenever the predetermined counting interval has elapsed.

The above-described objects can also be achieved by providing an apparatus for measuring the frequency of a pulse train signal, comprising: (a) first means for counting number of pulses of the pulse train signal for each predetermined counting interval of time $\Delta T$ and outputting a count value C representing the counted number of pulses whenever the predetermined counting interval of time $\Delta T$ has elapsed, the first means being updated and activated whenever the predetermined counting interval of time $\Delta T$ has elapsed so that the count value C within a predetermined frequency measuring interval of time T is outputted from the first means; (b) second means for updating the count value C of the first means to a value determined on the basis of the previous count value of the first means whenever the predetermined counting interval of time $\Delta T$ has elapsed; and (c) third means for storing the count value C of the first means and outputting the stored count value C of the first means whenever the predetermined counting interval of time $\Delta T$ has elapsed.

The above-described objects can also be achieved by providing the method for measuring a frequency of a pulse train signal, comprising the steps of: (a) receiving the pulse train signal and providing counting means for counting number of pulses of the received pulse train signal for each predetermined counting interval of time $\Delta T$ which is a division (T/n) of a frequency measuring interval of time T for the pulse train signal by a calculation constant n; (b) updating the count value C of the counting means to a value determined on the basis of the previous count value of the counting means whenever $\Delta T$ has elapsed; and (c) receiving the count value of the first means and providing memory means for storing the count value C of the first means and outputting the stored count value C whenever $\Delta T$ has elapsed, the output count value C being a value corresponding to the frequency of the pulse train signal within T.

BRIEF DESCRIPTION OF THE DRAWINGS

FIGS. 16 to 19(d) are signal timing charts of each circuit in the fourth preferred embodiment shown in FIGS. 14 and 15.

DESCRIPTION OF THE PREFERRED EMBODIMENTS

Reference will hereinafter be made to the drawings in order to facilitate understanding of the present invention.

FIRST PREFERRED EMBODIMENT

Figure 1:
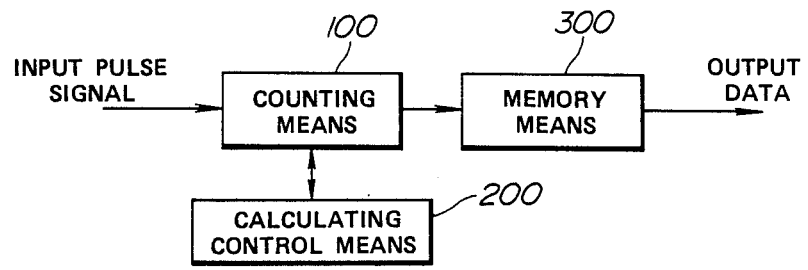
FIG. 1 is a functional block diagram of a first preferred embodiment of an apparatus for measuring the frequency of a pulse signal according to the present invention.

FIG. 1 shows in general concept a first preferred embodiment of a pulse signal frequency measuring apparatus according to the present invention.

The frequency measuring apparatus functionally shown in FIG. 1 includes: (a) counting means 100 for counting the number of pulses of a pulse signal inputted thereto, the counting means 100 being updated to a value as will be described later and restarted whenever a counting interval of time $T/\alpha$ determined on the basis of a frequency measuring interval of time T for a required resolution of the apparatus has elapsed; (b) calculating control means 200 for updating a count value C of the counting means 100, whenever the time interval $\Delta T$ defined as $T/\alpha$ has elapsed, to $C(1-1/\alpha)$ ($\alpha$ denotes a predetermined multiplier); and (c) memory means 300 for storing the output count value C of the counting means 100 and outputting the stored count value to a subsequent stage, e.g., a D/A (Digital-to-Analog) converter to convert the count value into a corresponding voltage (not shown) whenever the time interval $\Delta T$ has elapsed.

Figure 3:
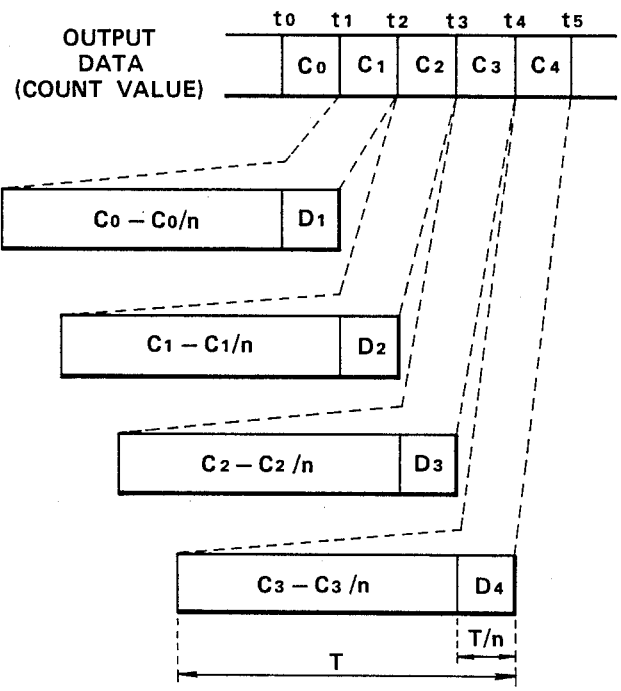
FIG. 3 is an explanatory view of output data of the output register shown in FIG. 2.

FIG. 3 shows output data of the memory means 300 shown in FIG. 1 when the above-described symbol $\alpha$ is n.

If the count value (=output data) C of the counting means 100 at a time $t_1$ is Co and the counting means 100 counts up by $D_1$ between the times $t_1$ and $t_2$, counting $Co(1-1/n)$ takes place while the output data indicates Co. Therefore, a value of $D_1$ counted up when the time reaches $t_2$ and is added to the output count data, i.e., $Co-Co/n$ so that the output data $C_1$ at the time $t_2$ is:

$$C_1=(Co-Co/n)+D_1.$$

In the way described above, the output data C is updated, i.e., refreshed at each counting interval of time $T/n$. In other words, an average of n count values from (n+1) number of times before a count is cut off (omitted) from the output data at the present time and a newly counted value D is added to the calculated value. Consequently, the frequency measurement in the same manner of the stagger ring method as described in the BACKGROUND OF THE INVENTION can be achieved.

Figure 2:
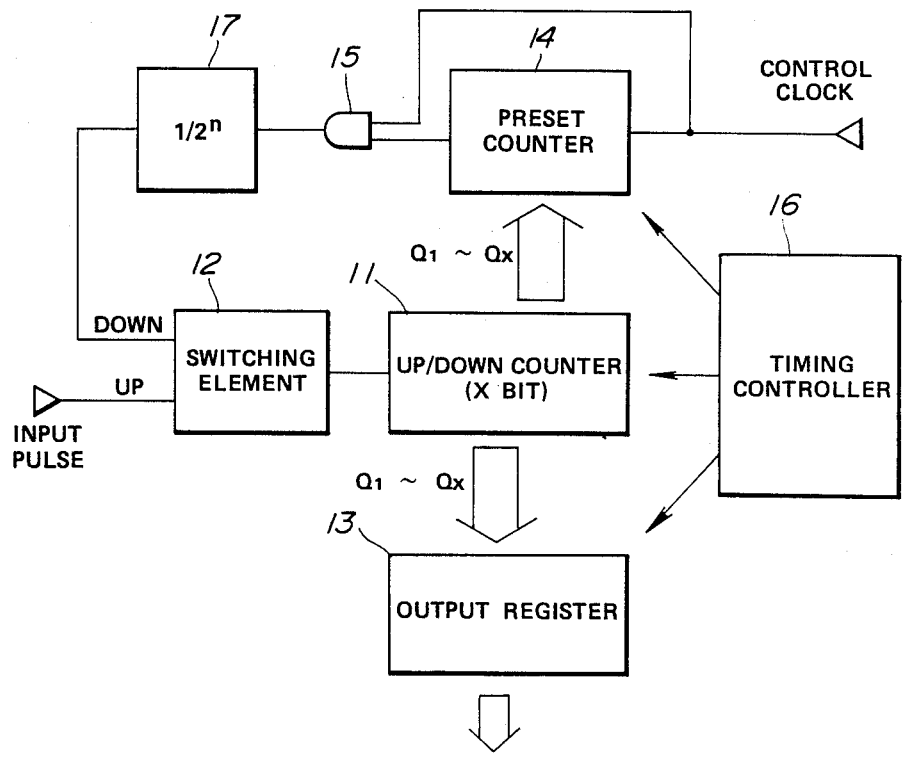
FIG. 2 is a specific circuit block diagram of the first preferred embodiment.

FIG. 2 shows a circuit block diagram of the first preferred embodiment.

In FIG. 2, an up/down counter 11 is updated and activated for each frequency counting time interval $T/2^n$ determined to achieve the required resolution. The up/down counter 11 counts up (incremental counting) in response to the pulses inputted through an up terminal of a switching element 12 associated with the up/down counter 11 and counts down (decremental counting) in response to pulses inputted through a down terminal of the switching element 12.

It is noted that the up/down counter 11 is a down count priority type.

The count value of the up/down counter 11 is supplied to an output register 13 which is refreshed for each output refreshing interval defined as $T/2^n$. In addition, the count value of the up/down counter 11 is also supplied to a preset counter 14. It is noted that a preset value represented by $Ci/2^n$ is preset to the preset counter 14, the preset value $Ci/2^n$ being the count value of the up/down counter 11 for a period of $T/2^n$.

The present counter 14 outputs the preset value to one input terminal of an AND gate 15 only during the receipt of a control clock signal preferably supplied from a timing controller 16. The control clock signal is also supplied to the other input terminal of the AND gate 15.

The up/down counter 11 is updated and activated in response to a reset signal derived from the timing controller 16 for each frequency counting interval of time $T/2^n$. The output register 13 latches the output count value of the up/down counter 11 in response to a latch signal derived from the timing controller 16 for each time $T/2^n$ and outputs the latched contents toward, e.g., a speedometer (not shown). The preset counter 14 latches the output count value of the up/down counter 11 in response to the latch signal from the timing controller 16. A $\frac{1}{2}^n$ frequency divider 17 divides the preset value of the preset counter 14 by $\frac{1}{2}^n$ and supplies the $\frac{1}{2}^n$ divided preset value to the down terminal of the switching element 12.

Figure 4:
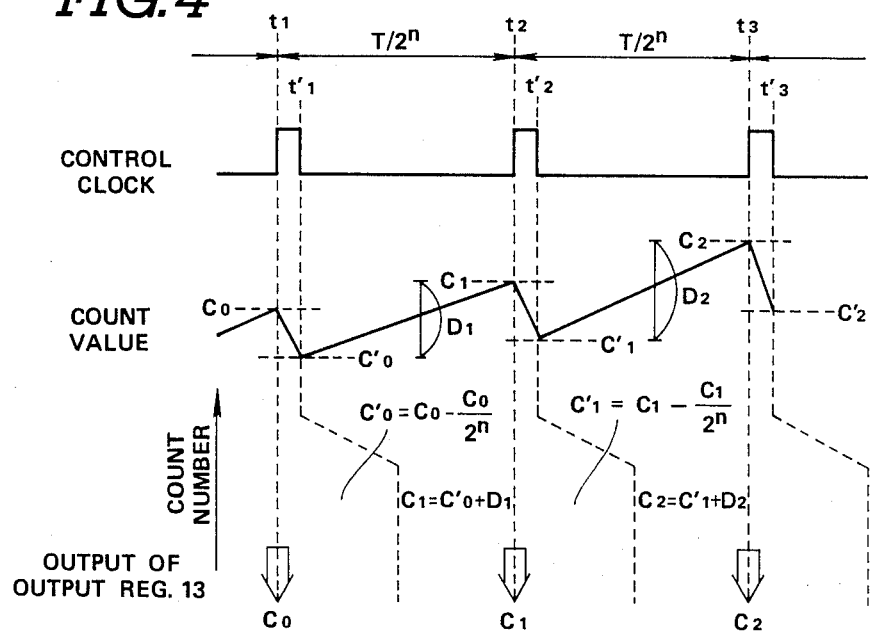
FIG. 4 is an output signal timing chart of the output register shown in FIG. 2.

Next, an operation of the first preferred embodiment will be described with reference to FIG. 4.

If the number of pulses counted by the up/down counter 11 until the time $t_1$ is reached is Co, the output register 13 latches the count value Co in response to the latch signal derived from the timing controller 16 at the time $t_1$. The preset counter 14 is preset to the preset value $Co/2^n$ derived from the up/down counter 11 which is frequency divided by the frequency divider 17. During a time slot between times $t_1$ and $t_1'$, the preset value of the preset counter 14 is supplied to the frequency divider 17 in response to the control clock. The down terminal of the switching element 12 receives the frequency divided preset value via the AND gate 15. Therefore, the up/down counter 11 receives the number of pulses corresponding to the frequency divided preset value during the time slot between times $t_1$ and $t_1'$. Then, the up/down counter 11 indicates the count value during the time slot expressed as follows: $Co'=Co-Co/2^n$.

At the time $t_1'$, an edge of the control clock signal supplied to the preset counter 14 and AND gate 15 falls and the down terminal of the switching element 12 receives no signal. At this time, the up/down counter 11 starts counting up from the input pulse signal. In addition, the preset value of the preset counter 14 is reset at the time of $t_1'$.

Suppose that the count value of the up/down counter 11 is incremented (counted) by $D_1$ upon receipt of the input pulse during a time slot between times $t_1'$ and $t_2$. The count value $C_1$ of the up/down counter 11 at the time $t_2$ is expressed as follows:

$$C_1=C_o'+D_1$$

Hence, the output register 13 is updated (refreshed) in response to the latch signal derived from the latch signal of the timing controller 16 at the time $t_2$. The output register 13 outputs the data expressed by $$C_1=C_o'+D_1$$

The preset counter 14 is preset to $C_1/2^n$ in response to the latch signal at the time $t_2$.

Then, during a time slot between the times $t_2$ and $t_2'$, the up/down counter 11 counts down in accordance with the frequency-divided preset value $C_1/2^n$. The count value thereof indicates $C_1-C_1/2^n=C_1'$ at the time $t_2'$. Next, the count value $C_2$ at the time $t_2$ is expressed as follows when the up/down counter 11 counts up the number of pulses $D_2$ upon receipt of the input pulse signal during a time slot between the times $t_2'$ and $t_3$.

$$C_2=C_1'+D_2$$

The output data of the output register 13 indicates as follows:

$C_2 = C_1' + D_2.$

The output register 13 is refreshed $2^n$ number of times within the frequency counting time interval $T/2^n$ by repeating the series of operations described above. In addition, the up/down counter 11 is updated and activated whenever the frequency counting time $T/2^n$ is reached. Since the output contents of the output register 13 indicates the number of pulses of the input pulse signal within a certain time period, the output contents of the register 13 indicates a value proportional to the frequency of the input pulse signal.

Figure 5:
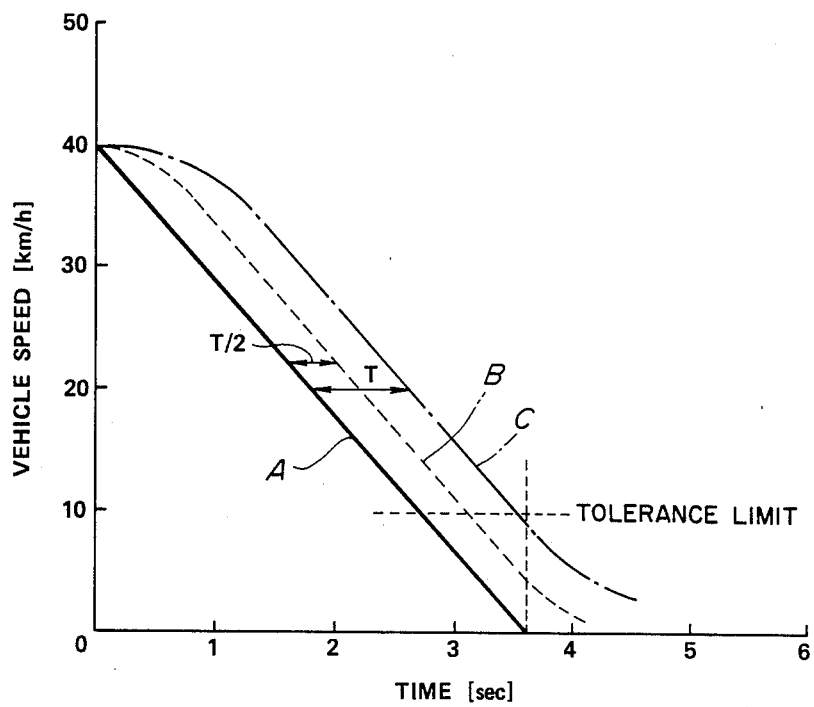
FIG. 5 is a graph for explaining a response characteristic of the first preferred embodiment shown in FIGS. 1 to 4.

FIG. 5 shows a graph representing a frequency responsive characteristic of the frequency measuring apparatus in the first preferred embodiment in a case when a sudden (abrupt) deceleration of 0.6 G occurs from a vehicle speed of 40 Km/h.

In FIG. 5, solid line A denotes an actual vehicle speed, broken line B denotes the indication by the speedometer when the frequency is measured in the staggar ring technique, and dot-and-dash line C denotes the result when the frequency is measured by the first preferred embodiment, and the frequency measuring time T is 0.9 seconds. The actual vehicle speed indicates 0 Km/h after 3.6 seconds, i.e., the vehicle stops. In the staggar ring method, the indicated value is delayed T/2 or 0.45 seconds with respect to the actual vehicle speed. In the first preferred embodiment, therefore, the pointer of the speedometer indicates about 9 Km/h with the vehicle stopped. However, in the speedometer of the vehicle, the pointer is set with a responsive tolerance to indicate 0 Km/h when the actual vehicle speed reduces and becomes about 10 Km/h. When the vehicle stops, therefore, the speedometer usually indicates 0 Km/h in the preferred embodiment. Therefore, no actual problem occurs in the responsive characteristic.

In the first preferred embodiment, such a calculation as $C(1 - 1/2^n)$ is carried out for the count value of the up/down counter 11 for each refreshing interval $T/2^n$. However, using the number of times $\alpha$ the refreshings are carried out within the frequency measuring interval of time T, such a calculation $C(1 - 1/\alpha)$ as described above may be carried out.

Since in the first preferred embodiment the counting of the input pulse signal is continued after the calculation of $C(1 - 1/\alpha)$ for the count value C is carried out for each counting time interval defined as $T/\alpha$ with the up/down counter (counting means) being refreshed for each counting interval of time $T/\alpha$ determined from the required resolution point of view, the frequency measurement having the same effect as in the staggar ring method can be achieved without use of $\alpha$ numbers of counters and a multiplexer in the above-described staggar ring technique. In addition, since the measurement result can be updated in an arbitrarily short time interval, the measurement in the frequency of the pulse signal can accurately be controlled in a shorter interval of time without reduction of the resolution required for the indication by the vehicle speedometer.

SECOND PREFERRED EMBODIMENT

Figure 6:
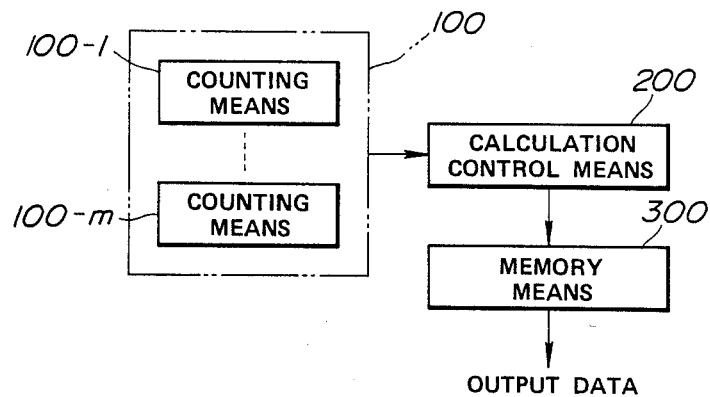
FIG. 6 is a functional block diagram of a second preferred embodiment of the pulse signal frequency measuring apparatus according to the present invention.

FIG. 6 shows a general concept of the frequency measuring apparatus in a second preferred embodiment.

In the second preferred embodiment shown in FIG. 6, at least m numbers of pulse counting means 100 (100-1 to 100-m) are provided repeating the reset and restart for each time $m \times T/N$ at times separated in time from each other by a counting time interval of $\Delta T$ specified as $T/N$ (N denotes a calculation constant). Furthermore, memory means 300 is provided for storing the data C corresponding to the frequency of the measured pulse signal within the frequency counting time T, the data C being the count values of the m numbers of counting means 100. In addition, calculation control means 200 is provided between the m numbers of the counting means 100 and memory means 300 for updating the data C of the memory means 300 for each time interval $\Delta T$ to the following:

$C - C \times m/\alpha + D,$ $\alpha$: calculation constant
D: latest count values of the m number of counting means 100 during the present counting interval of time $\Delta T$ at the time when the update is carried out.

Figure 7:
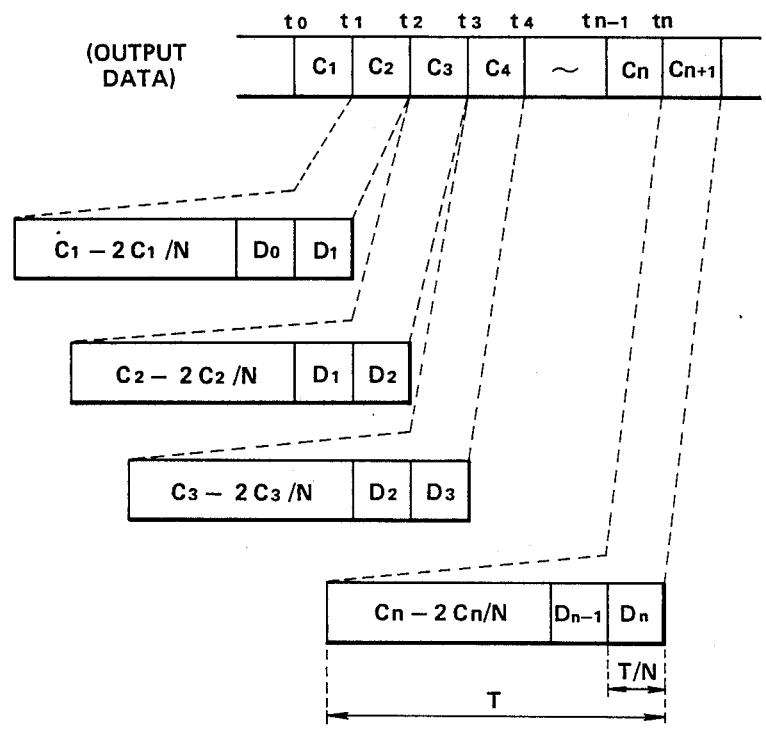
FIG. 7 is an explanatory view of output data of the output register shown in FIG. 8.

FIG. 7 shows the output data of the memory means 300 shown in FIG. 6 for explaining the function in the second preferred embodiment.

The data C is stored in the memory means 300 which corresponds to the number of measured pulses within the frequency measuring time T counted by means of the m number of counting means 100. The memory means 300 is updated for each refreshing time interval $\Delta T$.

The m numbers of counting means 100-1 to 100-m count the measured pulse numbers and are reset and restarted for each time $\Delta T \times m$ with each reset timing of the counting means 100-1 to 100-m separated in time by the time $\Delta T$ specified as $T/N$. In addition, the calculation control means 200 controls the memory means 300 so that the stored data C of the memory means 300 is calculated to provide $C - C \times m/\alpha + D$, thus the data C being updated. The refreshed data is outputted to another stage of apparatus (not shown) from the memory means 300.

Suppose that in FIG. 7 $\alpha = N$, $m = 2$, the output data of the memory means 300 at a time $t_n$ is $C_n$, and one of the counting means 100-m counts up $(D_{n-1} + D_n)$ during time slot between times $t_{n-1}$ and $t_n$. The following calculation is carried out for the output data $C_n$.

$C_n - (2C_n/N) + D_{n-1} + D_n,$ $D_n$: a latest count value at the latest time interval $\Delta T$ outputted from the counting means 100 at the time of updating, and
$D_{n-1}$: a second latest count value one time $\Delta T$ before the latest count value $D_n$ of the counting means 100 at the time of updating.

Thus, the data C is updated (refreshed) at a period defined as $T/N$.

Figure 8:
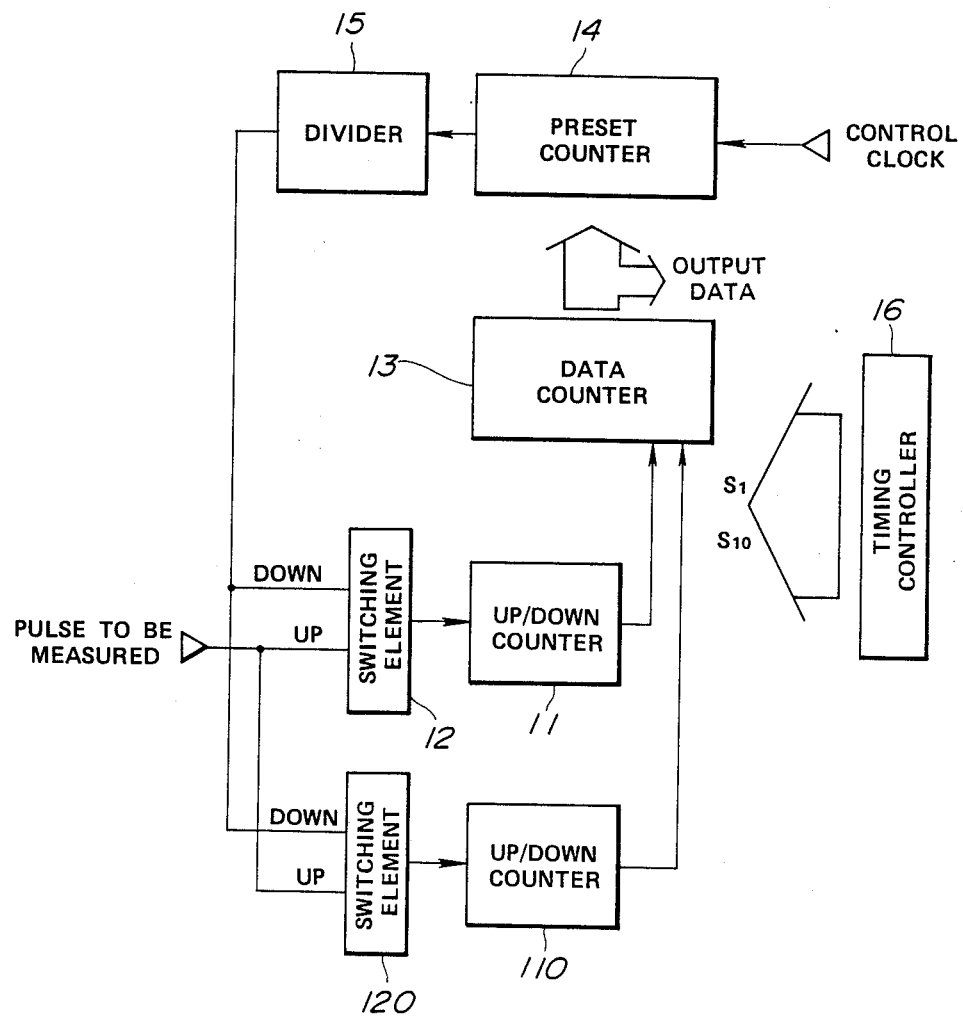
FIG. 8 is a specific circuit block diagram of the second preferred embodiment.

FIG. 8 shows a circuit block diagram of the second preferred embodiment.

It is noted that symbol T denotes the frequency measuring time determined in terms of the required resolution and symbol T/N denotes the refreshing interval of the output data.

In FIG. 8, the frequency measuring apparatus includes a plurality of, i.e., two, up/down counters 11, 110 whose input terminals are connected to respective switching elements 12, 120, for counting up the number of pulses received at up terminals of the corresponding switching elements 12, 120 and for counting down the number of pulses received at down terminals thereof.

The up counting and down counting operations are carried out in response to timing signals $S_1$ and $S_{10}$ to be described later. The switching element 12 enables the passage of the input pulses through the down terminal thereof in response to the timing signal $S_1$ and therefore the up/down counter 11 counts down. Thereafter, the up/down counter 11 is reset to restart the operation of counting. In the same way, the other switching element 120 enables the passage of the input pulses through the down terminal thereof in response to the timing signal $S_{10}$ and therefore the up/down counter 110 counts down. Thereafter, the up/down counter 110 is reset to restart the up counting. It is noted that both up/down counters 11, 110 are reset and restarted at different timings deviated by a time defined as T/N.

The counted data are supplied to a data counter 13 which is refreshed for each refreshing time interval defined as $\Delta T$. The data counter 13 counts up or counts down the count value derived from either of the up/down counters 11 or 110 in response to a falling edge of a control clock signal $C_c$ from a timing controller 16.

That is to say, the data counter 13 carries out the count up when the count value of either the up/down counter 11 or 110 indicates positive and counts down when it indicates negative. It is noted that the output signal of the data counter 13 is supplied to the subsequent stage of equipment such as a drive circuit for the speedometer as the output data of the measuring apparatus shown in the second preferred embodiment.

In addition, the output signal of the data counter 13 is supplied to a preset counter 14 and the count value $C_i$ (output data) of the data counter 13 is preset for each time defined as T/N.

The preset counter 14 outputs the preset value $C_i$ a frequency divider 15. The divider 15 carries out a frequency division of the input preset value by 2/N and outputs the frequency-divided preset value to the down terminals of the switching elements 12, 120. Since the switching elements 12, 120 enable the passage of the pulse signal at the down terminals thereof, i.e., the two up/down counters 11, 110 are of down count priority types, the up/down counters 11, 110 counts down in accordance with the pulses derived from the frequency divider 15. The timing controller 16 provides the timing signals $S_1$, $S_{10}$, and control clock signal $C_c$.

Figure 9:
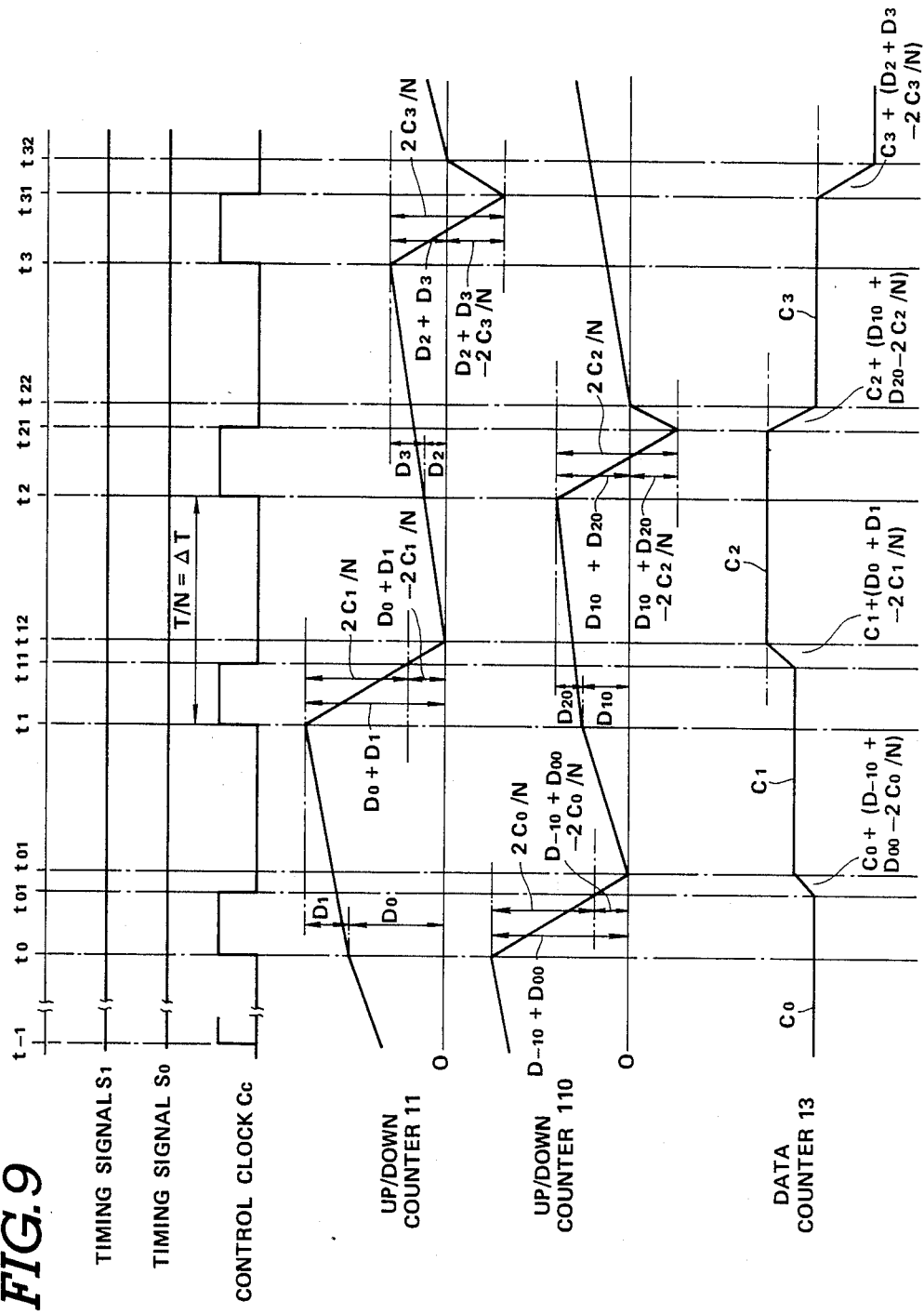
FIG. 9 is a signal timing chart of each circuit shown in FIG. 8 for explaining operation of the second preferred embodiment.

Next, the whole operation of the frequency measuring apparatus in the second preferred embodiment will be described with reference to FIG. 9.

Suppose that stored data of the data counter 13 at a time $t_1$ is $C_1$ and the number of pulses counted by the up/down counter 11 during a time slot between times $t_{-1}$ and $t_1$ is $D_o+D_1$. It is noted that symbol $D_o$ denotes the count value thereof 11 during a time slot between times $t_{-1}$ and $t_o$ and symbol $D_1$ denotes that during a time slot between the times $t_o$ and $t_1$.

The data $C_1$ of the data counter 13 is preset in the preset counter 14 in response to the timing signal $S_1$ outputted from the timing controller 16 at the time $t_1$. Since the control clock signal $C_c$ is active during the time slot between the times $t_1$ and $t_{11}$, the data represented by $2C_1/N$ which is a frequency division of the preset value through the frequency divider 15 is supplied to the down terminal of the switching element 12. The switching element 12 enables signal passage through the down terminal only when the control clock signal $C_c$ is active so that the up/down counter 11 counts down the count value $(D_o+D_1)$ by the frequency division data $2C_1/N$ during the time slot between the times $t_1$ and $t_{11}$. Then, at the time $t_{11}$, the count value of the up/down counter 11 indicates $D_o+D_1-2C_n/N$.

The up/down counter 11 is reset at the time $t_{12}$ after the control clock signal $C_c$ has fallen at the time $t_{11}$. Thereafter, the up/down counter 11 counts up the measured pulse signal received at the up terminal of the switching element 12. In addition, the count value of the up/down counter 11 at the time $t_{11}$ is added to the data $C_1$ of the up/down counter 13 during the time slot between times $t_{11}$ and $t_{22}$. Therefore, the contents of the data counter 13 at the time $t_{12}$ is as follows:

$$C_1+(D_o+D_1-2C_1/N)=C_2$$

Next, suppose that the stored data of the data counter 13 is $C_2$ and the number of pulses counted by the up/down counter 110 during a time slot from the time $t_o$ to the time $t_2$ is $D_{10}+D_{20}$ (since the time slot between the time to and the time $t_{11}$ is sufficiently short with respect to 2T/N, the counting of the pulses, e.g., the vehicle speed, may be carried out substantially for the time defined as 2T/N). It is noted that $D_{10}$ denotes a count value between times $t_o$ and $t_1$ and $D_{20}$ denotes a count value during the time slot between the time $t_1$ and the time $t_2$.

The data $C_2$ of the data counter 13 is preset to the preset counter 14 in response to the timing signal $S_{10}$ outputted from the timing controller 16 at the time $t_2$. Since the control clock signal $C_c$ is active between the times $t_2$ and $t_{21}$, the data $2C_2/N$, which is the frequency division of the preset value through the divider 15, is inputted to the down terminal of the switching element 120. Since the switching element 120 enables the passage of the input pulses at the down terminal thereof with a priority higher than that at the up terminal thereof, the up/down counter 110 counts down the count value $(D_{10}+D_{20})$ in response to the frequency division data $2C_2/N$. Therefore, the up/down counter 110 outputs the count value indicating $D_{10}+D_{20}-2C_2/N$ at the time $t_{21}$.

The up/down counter 110 is reset at the time $t_{22}$ after the corresponding edge of control clock $C_c$ has fallen at the time $t_{21}$. Thereafter, the up/down counter 110 counts the measured pulse signal inputted to the up terminal of the switching element 120. The count value of the up/down counter 110 at the time $t_{21}$ is added to the data $C_2$ of the data counter 13 during a time Slot between the time $t_{21}$ and the time $t_{22}$. The contents of the data counter 13 at the time $t_{22}$ are $C_2+(D_{10}+D_{20}-2C_2/N)$. It is noted that the count value $(D_{10}+D_{20}-2C_2/N)$ of the up/down counter 110 at the time $t_{21}$ indicates negative as shown in FIG. 9 and therefore the contents of the data counter 13 at the time $t_{22}$ is smaller than that at the time $t_2$.

The data counter 13 is refreshed N number of times within the frequency counting interval T. In addition, the up/down counters 11, 110 are reset at each time T/N and start counting from zero. The output data of the data counter 13 indicates the number of pulses within the counting time T/N and indicates a value proportional to the desired frequency of the input pulse signal.

Figure 10:
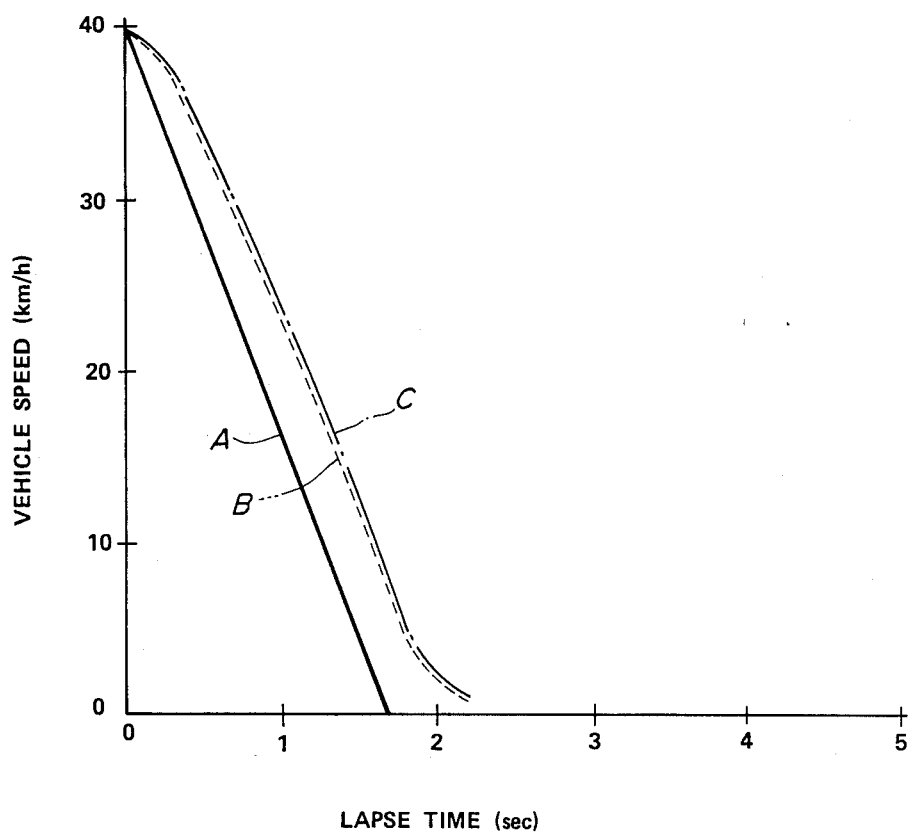
FIG. 10 is a graph for explaining the responsive characteristic of the second preferred embodiment shown in FIGS. 6 to 9.

FIG. 10 shows a graph representing frequency responsive characteristics of various frequency measuring apparatus including the second preferred embodiment in a case when sudden deceleration of 0.7 G occurs at a time when vehicle speed of 40 Km/h and the vehicle finally stops.

In FIG. 10, the solid line A denotes the actual vehicle speed, the broken line B denotes the result of the frequency measurement in the staggar ring method, and the dot-and-dash line C denotes the result of the frequency measurement in the second preferred embodiment. It is noted that the frequency measuring time T is 0.7 seconds and N is 16. The actual vehicle speed is 0 Km/h after 1.62 seconds, i.e., the vehicle stops. In the staggar ring method and the second preferred embodiment, each indicated value is delayed T/2, i.e., 0.35 seconds. Hence, the indicated value in the second preferred embodiment is in about 9 Km/h with the vehicle stopped. However, no problem in speed indication occurs in the same way as the first preferred embodiment since a predetermined responsive tolerance is provided in the speedometer.

Although in the second preferred embodiment the two up/down counters 11, 110 are used to calculate $C-2C/N+D_{n-1}+D_n$ for the data C of the data counter 13 for each refreshing interval T/N, m numbers of the up/down counters may be used to calculate as follows: $C-C \times m/\alpha+D$, wherein $\alpha$ denotes a calculation constant substantially equal to the number of refreshes within the frequency measuring time T and D denotes count values of the up/down counters within m time intervals $\Delta T$. In this case, the frequency divider 15 may divide the preset value by $m/\alpha$.

The effects of the frequency measuring apparatus in the second preferred embodiment are substantially the same as that in the first preferred embodiment described above.

THIRD PREFERRED EMBODIMENT

Figure 11:
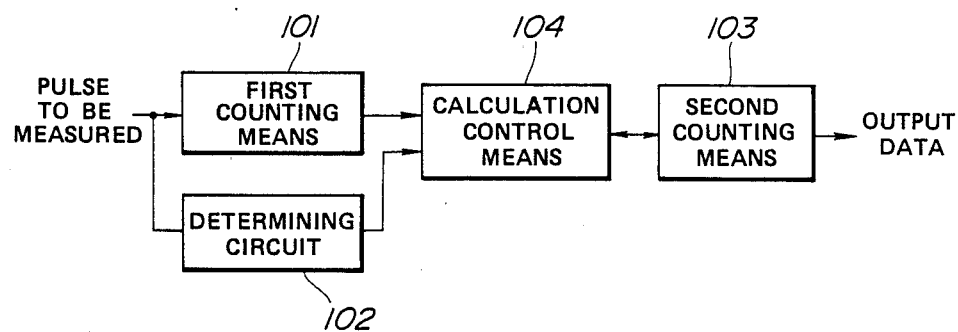
FIG. 11 is a functional block diagram of a third preferred embodiment of the pulse signal frequency measuring apparatus.

FIG. 11 shows a general concept of the frequency measuring apparatus in a third preferred embodiment.

The measuring apparatus shown in FIG. 11 includes: (a) first counting means 101 for counting the number of pulses in the pulse signal inputted within a time determined by T/n (T denotes the frequency counting time and n denotes the number of times the refreshing operations are carried out). the counting means 101 being reset and restarted for each time defined as T/n; (b) determining means 102 for determining the magnitude of the rate of change in the number of pulses to be measured with respect to time; (c) second counting means 103 for counting the number of pulses corresponding to the frequency of the measured pulses within the frequency measuring time interval T counted by the first counting means and outputting the data C; and (d) calculation controlling means 104 for updating the data C of the second counting means 103 for the time interval T/n to the following: $C-M_1 \times C/\alpha+M_2 \times D$ (wherein $\alpha$ denotes a calculation constant. D denotes the latest count value of the first counting means 101 at the time of updating, and $M_1$ and $M_2$ denote values determined according to the result of determination in the determining means 104.

In FIG. 11, the second counting means 103 stores the data C corresponding to the measured pulse numbers within the frequency measuring time T counted by the first calculating means 101 and is updated at each refreshing time interval $\Delta T$ (=T/n). The first counting means 101 counts the input number of measured pulses and is reset and restarted for each time defined as $\Delta T$. The determining means 102 determines the magnitude of the rate of change in the number of measured pulses with respect to time. The calculation controlling means 104 calculates $C-M_1 \times C/\alpha+M_2 \times D$ for the data C of the second counting means 103 for each time defined as $\Delta T$ (=T/n) so that the data C of the second counting means 103 is updated to $C-M_1 \times C/\alpha+M_2 \times D$. Then, the refreshed data is outputted by the second counting means 103. The values of $M_1$ and $M_2$ are changed according to the result of the determining means 102. Hence, when the determination result indicates small magnitude as compared with a predetermined value, $M_1$ and $M_2$ are set to, e.g., 1. On the other hand, when the determination result is large, $M_1$ and $M_2$ are set to two or more. The resolution when the determination result indicates a small magnitude and the responsive characteristic when the determination result indicates a large magnitude are simultaneously improved, respectively.

Figure 12:
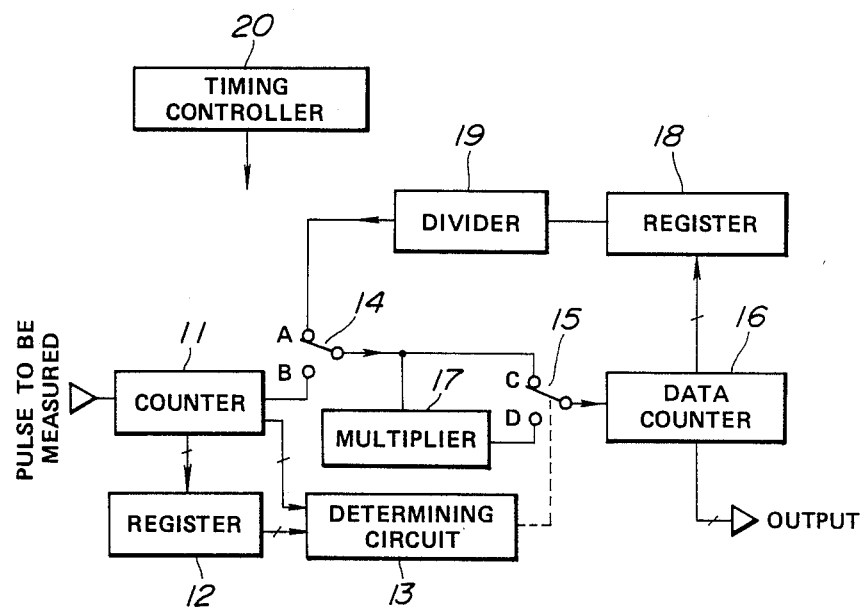
FIG. 12 is a specific circuit block diagram of the third preferred embodiment.

FIG. 12 shows a circuit block diagram of the frequency measuring apparatus in the third preferred embodiment.

The frequency measuring apparatus, as shown in FIG. 12, includes: (a) a counter 11 for counting the measured pulse signal inputted for each time defined as T/n and outputting the count value $D_i$; and (b) a register 12 for storing the old count value (indicated by $D_{i-1}$) at a timing reset to count the number of pulses in the next counting time interval T/n. A determining circuit 13 is interposed between the counter 11 and register 12 in which both data $D_i$ and $D_{i-1}$ are compared for each time defined as T/n.

The output terminal of the counter 11 is connected to a data counter 16 via switches 14 and 15 or via the switch 14, a multiplier 17, and switch 15. The count value $C_i$ of the data counter 16 corresponds to a measurement of the number of pulses for the frequency counting time defined as T. The count value $C_i$ is refreshed when the refreshing interval denoted by T/n is reached. At the refresh timing, the old measurement data obtained prior to the present refreshing time is supplied and stored into a register 18. The register 18 is updated at each time defined as T/n. The register 18 supplies the stored data $C_{u-1}$ to the frequency divider 19 at the time when T/n is reached. The frequency divider 19 is connected to the data counter (up/down counter) 16 via the switches 14 and 15 or via the switch 14, multiplier 17, and switch 15. A main contact of the switch 14 is switched from a contact A to a contact B for each time to be described later. When the main contact thereof is switched to the contact A, the data counter 16 counts down in accordance with the input pulse signal. When the main contact thereof is switched to the contact B, the data counter 16 counts up in accordance with the input pulse signal. The switch 15 is switched in response to an output signal of the determining circuit 13. When $|D_i - D_{i-1}| \leq R$ (R denotes a reference value), the main contact of the switch 15 is switched to a contact C. When $|D_i - D_{i-1}| > R$, the main contact of the switch 15 is switched to a contact D. When a difference between the number of input pulses during two adjacent counting intervals is large, e.g., the vehicle speed change rate is large, the data counter 16 counts down or counts up the data representing the number of pulses multiplied by M inputted from the switch 14. Each circuit is controlled by means of a timing controller 20.

Figure 13:
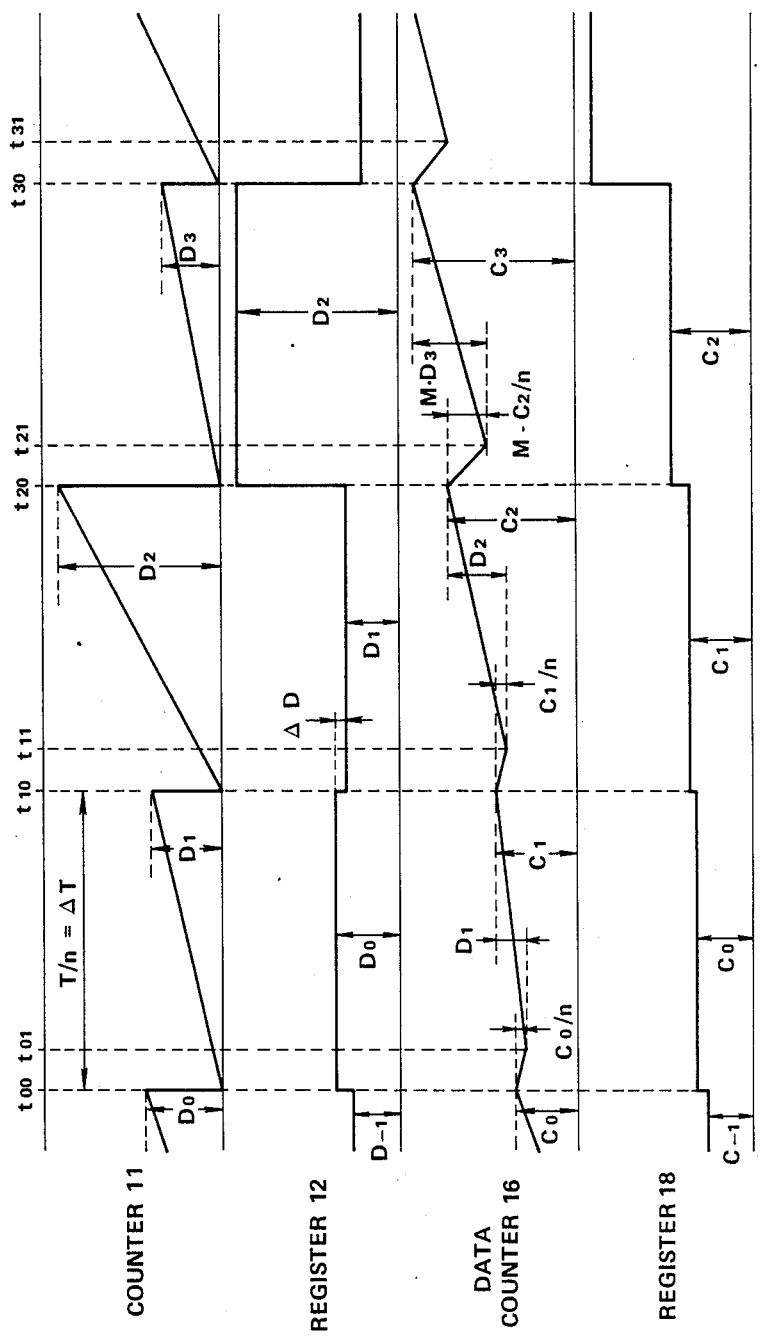
FIG. 13 is a signal timing chart of each circuit in the third preferred embodiment for explaining operation of the third preferred embodiment.

Next, the whole operation of the frequency measuring apparatus in the third preferred embodiment will be described with reference to a timing chart of FIG. 13.

The counter 11 counts up the number of input pulses from zero to $D_1$ during a time interval defined as $T/n=\Delta T$ from a time $t_{oo}$ to a time $t_{10}$. Suppose that the counted value at the time $t_{10}$ is $D_1$, the stored value of the register 12 at the time $t_{10}$ is an old count value $D_o$ of the counter 11, the count value of the data counter 16 at the time $t_{10}$ through the down count and up count during the time interval defined as $\Delta T$ from the time $t_{oo}$ to the time $t_{10}$ is $C_1$, and the stored value of the register at the time $t_{10}$ is the old count value $C_o$ of the data counter 16.

At the time $t_{10}$, the determining circuit 17 determines Whether a difference between the count value $D_1$ of the counter 11 and the stored value $D_o$ of the register 12, i.e., $|D_1-D_0|=\Delta D$ is below a reference value R. If, $\Delta D \leq R$ at the time $t_{10}$, the switch 15 is changed to the contact C. Upon the reset of the counter 11, the count value $D_1$ is registered in the register 12. In addition, the count value $C_1$ of the data counter 16 is stored in the other register 18 at this moment and the switch 14 is switched to connect a contact A. Then, the stored value $C_1$ of the register 18 is divided by the frequency divider 19. The pulses whose numbers are represented by $C_1/n$ are supplied through the switches 14, 15 to the data counter 16. The data counter 16 counts down in accordance with $C_1/n$ during the time slot between the times $t_1$ and $t_{11}$.

At the time $t_{11}$, all pulses whose numbers are represented by $C_1/n$ are counted by means of the data counter 16. At this time, the switch 14 is switched to connect contact B. Since the switch 14 is switched to the contact B until the time $t_{20}$, the data counter 16 counts up the count value of the counter 11 during the time slot between the times $t_{11}$ and $t_{20}$. Hence, the count value $C_2$ of the data counter 16 at the time $t_{20}$ indicates $C_2=C_1-C_1/n+D_2 \ldots$ (1).

The determining circuit 13 compares the difference $\Delta D$ between the count value $D_2$ of the counter 11 and stored value $D_1$ of the register 12 with the reference value R. If, $\Delta D > R$, the switch 15 is switched to connect the contact D. Then, the counter 11 is reset and the count value thereof $D_2$ is registered in the register 12. At this time, the count value $C_2$ of the data counter 16 is registered in the register 18 and the switch 14 is changed to the contact A. The stored value $C_2$ of the register 18 is divided by means of the frequency divider 19 and the value of $C_2/n$ is supplied to the multiplier 17 via the switch 14. Since the multiplier 17 calculates as $M \times C_1/n$, the value $M \times C_2/n$ is inputted to the data counter 16 via the switch 15. During the time slot between the times $t_{20}$ and $t_{21}$, the data counter 16 counts down by $M \times C_2/n$. The switch 14 is switched to connect the contact B at the time $t_{21}$. The switch 14 is switched to the contact B at the time $t_{21}$. The switch 14 remains at contact B until the time $t_{30}$. When the switch 15 is switched to connect the contact D, the pulses whose numbers are the multiplication product of the count value of the counter 11 by and M are supplied to the data counter 16. Then, the data counter 16 counts up. Hence, the count value $C_3$ of the data counter at the time $t_{30}$ indicates as follows: $C_3=C_2-M \times C_2/n+M \times D_3 \ldots$ (2).

It is noted that since each of the time slots between $t_{00}$ and $t_{01}$, between $t_{10}$ and $t_{11}$, and between $t_{20}$ and $t_{21}$ are sufficiently short as compared with the time $T/n$, the counting of the number of pulses to be measured. e.g., representing the vehicle speed can be carried out for each counting interval of time defined as $T/n$.

The above-described series of operations are carried out for each of the time intervals $\Delta T$, the data counter 16 is refreshed n number of times within the pulse signal frequency measuring time T. In addition, the counter 11 is repeatedly reset to zero and restarted whenever the predetermined counting time interval $\Delta T$ has elapsed. When the difference between the sequential count results of the counter 11 is equal to or greater than the reference value R, the pulse numbers supplied to increment (count up) or decrement (count down) the data counter 16 are multiplied by M through the multiplier 17. The count value within the data counter 16 is changed more than in a normal case. Hence, the responsiveness of the frequency measuring apparatus to the change in the number of pulses of the measured pulse signal is improved.

It is noted that if the plurality of multipliers having mutually different values of M are provided, the value of the multiplier M is selected according to the rate of change in the count value of the counter 11, a larger multiplier (, e.g., 2) is used when the rate of change is large, and a smaller multiplier (, e.g., 1) is used when the rate of change is small, the responsive characteristic and resolution of the frequency measuring apparatus in the third preferred embodiment can be improved remarkably.

Although, symbol n in the above equation (1) denotes the number of times the refreshing operations are carried out, any value in the vicinity of n can be used. Although in equation (2), the same value of M is used in both of the up count and down count of the data counter, different values may be used. Furthermore, the change rate of the number of pulses to be measured may be derived from a circuit other than the determining circuit. The same effects as that in the first or second preferred embodiment can be achieved in the third preferred embodiment.

FOURTH PREFERRED EMBODIMENT

Figure 14:
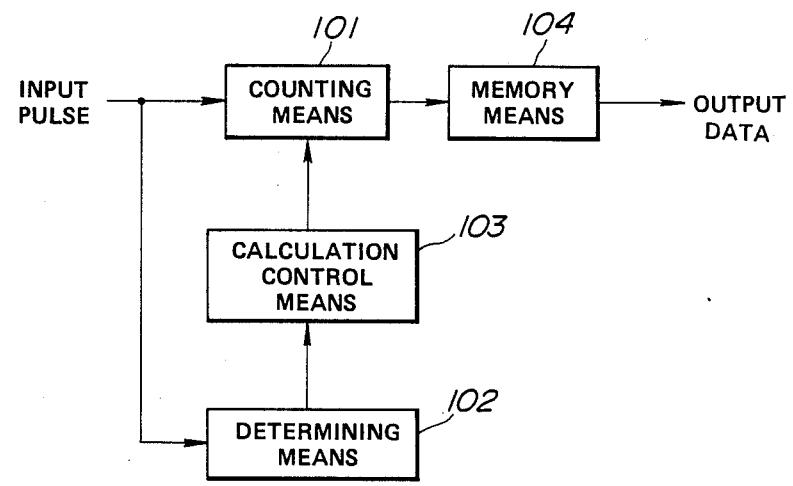
FIG. 14 is a functional block diagram of a fourth preferred embodiment of the pulse signal frequency measuring apparatus.

FIG. 14 shows a general concept of the frequency measuring apparatus in a fourth preferred embodiment.

The frequency measuring apparatus in the fourth preferred embodiment, as shown in FIG. 14, includes: (a) counting means 101 which is repeatedly updated and restarted at a predetermined counting time interval $T/n$ (n denotes a natural number) determined in terms of the required resolution for counting the input pulse numbers and outputting the count value C corresponding to the frequency value of the input pulse signal within the frequency measuring time T; (b) determining means 102 for determining a magnitude of the rate of change in the number of measured pulses with respect to time; (c) calculation control means 103 for updating the count value C of the counting means 101 for each counting interval defined as $\Delta T$ to $C(1-1/M)$ (M denotes a value determined in the determining means 102); and (d) memory means 104 for storing the output data of the counting means 101 and outputting the stored contents for each counting interval defined as $\Delta T$.

The counting means 101 counts the number of input pulses and is updated to the value described above and restarted whenever the predetermined time interval defined as $T/n$ has elapsed. In addition, the determining means 102 determines the magnitude of the change rate in the number of pulses to be measured. A numerical value M determined according to the magnitude of the rate of change in the number of pulses to be measured is supplied to the calculation controlling means 103. If the count value of the counting means 101 for the frequency measuring time T is C, the update of the counting means 101 is carried out after such a calculation as C(1−1/M) is carried out. The output data of the counting means 101 is stored in the memory means 104 and outputted for each counting interval defined as ΔT.

Figure 15:
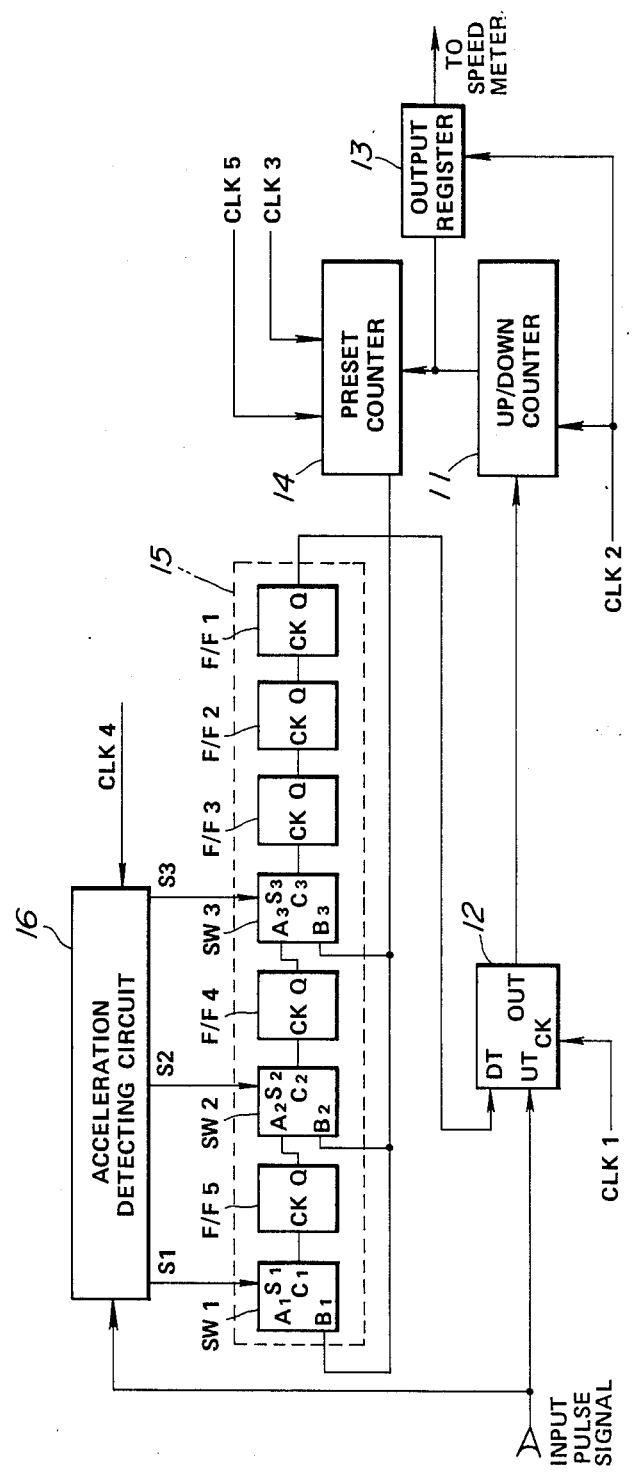
FIG. 15 is a specific circuit block diagram of the fourth preferred embodiment.

FIG. 15 shows a block diagram of the frequency measuring apparatus in the fourth preferred embodiment applied to the vehicle speedometer.

It is noted that T denotes the frequency measuring time interval and $2^n$ (n: natural number, in this embodiment, n=8 at the maximum) denotes the number of times the refreshing operations are carried out.

In FIG. 15, an up/down counter 11 is updated and restarted whenever a frequency counting interval time defined as $T/2^n$ which is required to achieve the required resolution, has elapsed. The up/down counter 11 counts up in accordance with the number of pulses representing the vehicle speed and inputted via an up terminal UT of a switching element 12 and counts down in accordance with the number of pulses inputted via a down terminal DT of the switching element 12. An up count mode or down count mode of the up/down counter 11 is selected in response to a mode selection signal CLK 2. One of the up and down input terminals of the switching element 12 is selected in response to a terminal switching signal CLK 1. The contents of the up/down counter 11 are supplied to the output register 13 and refreshed at an output refresh interval defined as $T/2^n$. In addition, the contents of the up/down counter 11 are also supplied to a preset counter 14. The count value of the up/down counter 11 is preset by the preset counter 14 in response to a preset signal CLK 3.

Only while the preset counter 14 receives the down count signal CLK 5 is its preset value supplied to a frequency divider 15. In addition, the input pulse to be measured is also supplied to an acceleration detection circuit 16 to detect a magnitude of acceleration/deceleration (change rate of the vehicle speed with respect to time) of the vehicle.

The acceleration detection circuit 16, e.g., includes a counter and two registers and a comparator. The counter in the circuit 16 counts the number of input pulses representing the vehicle speed. The count value of the counter is stored in one of the two registers therein in response to a latch signal CLK 4 outputted at a time at which the count value of the up/down counter 11 is preset. At this time, the counter is updated, and, thereafter, counts the number of input pulses representing the vehicle speed, and supplies the count value to store it in the other register at the time of receipt of a latch signal CLK 4. Then, magnitudes of the stored values in both registers are compared by means of the comparator.

The comparator in the circuit 16 detects the following three cases: (1) larger than a predetermined reference acceleration value; (2) larger than a predetermined reference deceleration value; and (3) smaller than both reference acceleration and reference deceleration. According to the result of comparison, three frequency division ratio control signals S1 to S3 as shown in Table 1 below are outputted to the frequency division circuit (frequency divider) 15. The frequency division ratios are previously set according to delay times of a drive system for driving the pointer of the speedometer installed in the vehicle to eliminate indication delay of the pointer during a sudden acceleration state and sudden deceleration.

TABLE 1

|  | S1 | S2 | S3 | Frequency Division Ratio |
|---|---|---|---|---|
| Sudden Acceleration | 1 | 0 | 0 | 32 |
| Normal Speed | 0 | 1 | 0 | 16 |
| Sudden Deceleration | 0 | 0 | 1 | 8 |

In Table 1, "1" denotes a high voltage level and "0" denotes a low voltage level such as zero.

The frequency division circuit 15 includes five stages of T type flip-flop circuits F/F1 to F/F5 and switches SW1 to SW3 whose switch positions are changed in response to the frequency ratio control signals S1, S2, and S3 derived from the acceleration detection circuit 16. According to the states of the respective control signals S1 to S3, any one of the above-listed frequency division ratio in Table 1 is selected. The frequency division circuit 15 divides the preset value inputted from the preset counter 14 in the way described above and supplies the frequency divided preset value to the down terminal of the switching element 12.

Next, the whole operation of the frequency measuring apparatus in the fourth preferred embodiment will be described with reference to FIGS. 16 to 19(d).

Figure 16:
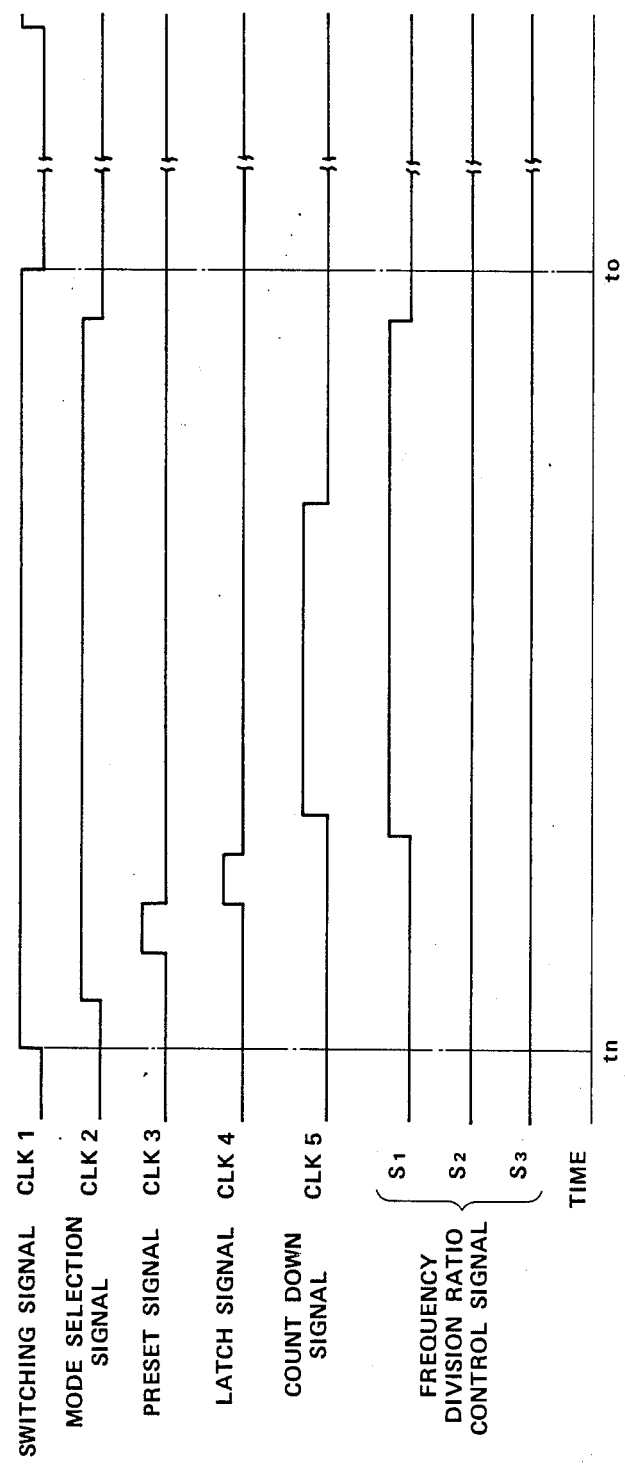
Figure 17D:
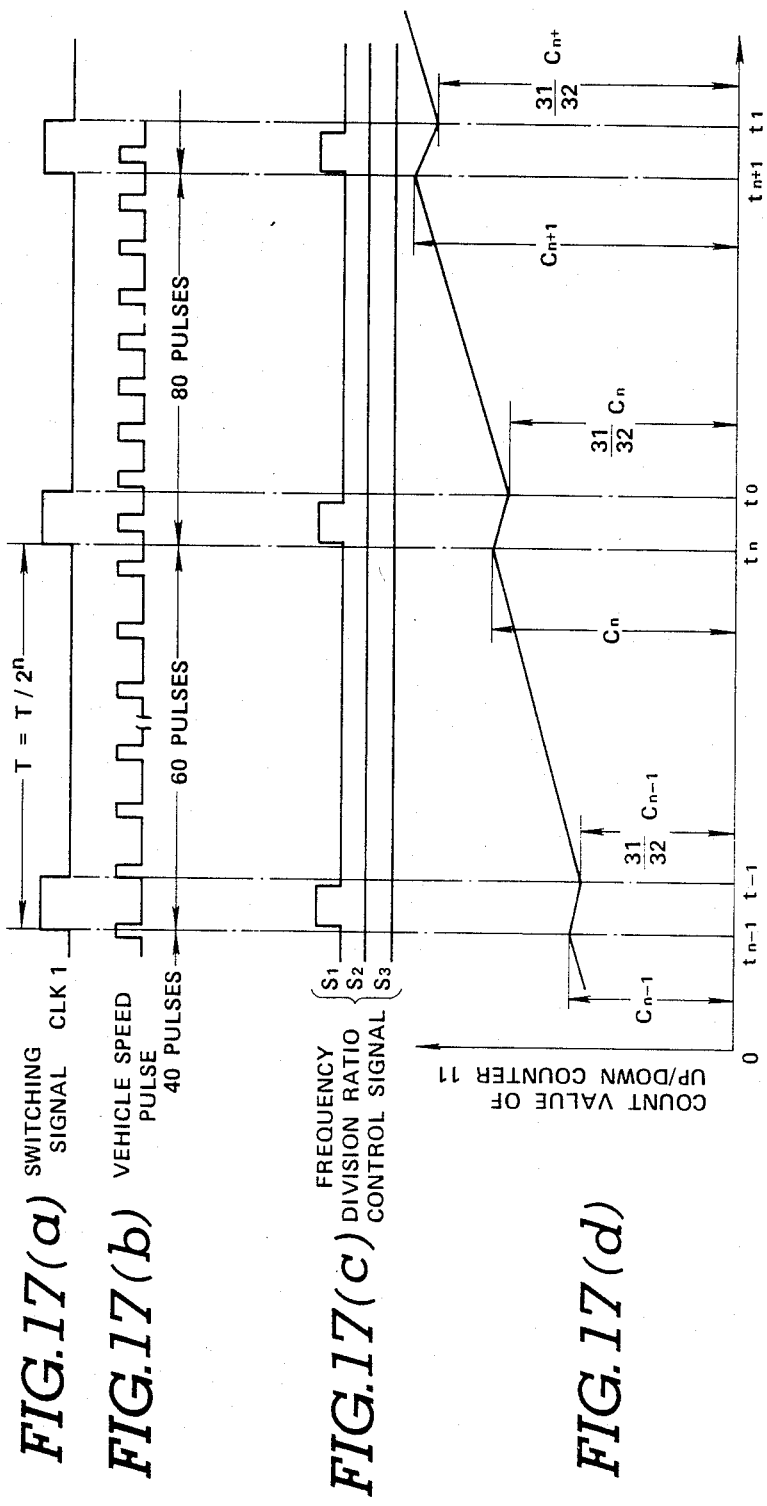

FIG. 16 shows a timing chart of each signal of the circuits shown in FIG. 15. As shown in FIG. 16, each signal represented by CLK 1 to CLK 4 and by S1 to S3 is outputted from the corresponding circuits. Each signal represented by CLK 1 to CLK 5 and the corresponding state of each circuit is as shown in the following Table 2.

TABLE 2

| SIGNAL | HIGH LEVEL | LOW LEVEL |
|---|---|---|
| CLK 1 | SELECTION OF DOWN TERMINAL DT OF SWITCHING ELEMENT 12 | SELECTION OF UP TERMINAL UT OF SWITCHING ELEMENT 12 |
| CLK 2 | DOWN COUNT MODE OF UP/DOWN COUNTER 11 | UP COUNT MODE OF UP/DOWN COUNTER 11 |
| CLK 3 | COUNT VALUE IS PRESET TO THE PRESET COUNTER 14 | — |
| CLK 4 | COUNT VALUE OF ACC. DET. CIRCUIT 16 IS LATCHED, THE ACC. IS DETECTED AND SIGNALS S1 TO S3 ARE OUTPUT | — |
| CLK 5 | PRESET VALUE FROM THE PRESET COUNTER IS OUTPUTTED | — |

The operation of measuring the vehicle speed in the fourth preferred embodiment will be described below with reference to FIG. 16 to FIG. 19(d).

(1) Sudden Acceleration (e.g., Due to a Strong Depression of an Accelerator Pedal)

FIGS. 17(a) to 17(d) show the timing charts of signals at the respective circuits during the sudden acceleration.

Suppose now that the number of input pulses during a time slot between times $t_{n-2}$ and $t_{n-1}$, is 40, the number of pulses during a time slot between times $t_{n-1}$ and $t_n$ is 60, the number of pulses during a time slot between times $t_n$ and $t_{n+1}$ is 80, and the count values of the up-/down counter 11 at respective times $t_{n-1}$, $t_n$, and $t_{n+1}$ indicate $C_{n-1}$, $C_n$, and $C_{n+1}$.

At a time $t_n$, the switching signal CLK 1 goes high level and the down terminal DT of the switching element 12 is selected. The switching signal CLK 1 is maintained at the high level until the time $t_o$ as shown in FIG. 16. During the time slot from the time $t_n$ to the time $t_o$, the signals CLK 2, CLK 3, CLK 4, and CLK 5 are outputted at the timing shown in FIG. 16. When the mode selection signal CLK 2 goes to high level, the up/down counter 11 enters the down count mode. When the preset signal CLK 3 goes to high level, the count value $C_n$ of the up/down counter 11 is preset in the preset counter 14. When the latch signal CLK 4 goes high level, the acceleration detection circuit 16 stores the count value of the counter 11 which indicates the number of input pulses (=60) during the time slot from time $t_{n-1}$ to time $t_n$ into the register of the circuit 16 as the new data. The acceleration detection circuit 16 compares the number of input pulses (=60) during the time slot between times $t_{n-1}$ and $t_n$, with the number of input pulses (=40) during the time slot between times $t_{n-2}$ and $t_{n-1}$ stored in the other register of the circuit 16 as the old data so that the abrupt acceleration of the vehicle is detected. Then, the acceleration detection circuit 16 outputs the frequency division ratio control signals S1 to S3. Since, in this case, the acceleration detection circuit 16 detects the sudden acceleration, the result is as follows: S1=HIGH LEVEL (1), S2=S3=LOW LEVEL (0).

Thus, an input terminal B1 is selected by the actuation of the switch SW1. Input terminals A2 and A3 are selected by the actuation of switches SW2 and SW3. In addition, the frequency division ratio when SW1 is actuated is 32 as shown in Table 1.

When the down count signal CLK 5 takes the high level state, the preset value $C_n$ is inputted from the preset counter 14 to the frequency division circuit 15. The frequency division circuit 15 supplies $C_n/32$ to the up/down counter 11 via the down terminal DT of the switching element 12. Consequently, the count value $C_n$ of the up/down counter 11 is decremented by the pulses supplied thereto. At the time $t_o$ at which the switching signal CLK 1 goes low level, the count value of the up/down counter 11 indicates $(31/32) C_n$. Then, the stored value of the output register 13 at the falling edge of the mode selection signal CLK 2 is updated from $(31/32)C_{n-1}$ to $(31/32)C_n$. The updated value $(31/32)C_n$ is outputted from the output register 13.

After the preset value is outputted from the preset counter 14, the down count signal CLK 5 goes low level. The output signal from the preset counter 14 is inhibited. Thereafter, the mode selection signal CLK 2 goes low level and the up/down counter 11 enters the up count mode. Next, when the switching signal CLK 1 goes low level at the time $t_o$ and the up terminal UT of the switching element 12 is selected, the number of input pulses representing the vehicle speed is supplied to the up/down counter 11 via the switching element 12. The up/down counter 11 sequentially starts to count up from the count value $(31/32)C_n$.

In addition, when the acceleration detection circuit 16 detects the sudden acceleration at the time $t_{n+1}$, the count value of the up/down counter 11 during the time slot between times $t_{n+1}$ and $t_1$ is:

$$C_{n+1} - \frac{1}{32} C_{n+1} = \frac{31}{32} C_{n+1}.$$

In the same way, the stored value of the output register 13 is updated to $(31/32)C_{n+1}$ and the value of $(31/32)C_{n+1}$ is outputted.

In this way, during the sudden acceleration, the count value of the up/down counter 11 counted up at each output refreshing interval $T/2^n$ is subtracted by $C/32$. The subtraction value $(31/32)C$ is outputted from the output register 13. Therefore, the effect of the present count value on the previous count value is reduced so that the vehicle speed is accurately indicated and the responsive characteristic of the indicated value for vehicle speed variations is accordingly improved. It is noted that the pulses representing the vehicle speed during the selection of the input signal at the down terminal DT of the switching element 12 are registered in the register and are supplied to the up/down counter 11 in the next up count mode.

(2) Normal Running (e.g., Cruising Speed)

The operation timings of the respective parts and contents of operations are substantially the same as those at the time of the sudden acceleration. However, during the normal running of the vehicle, a value by which the up/down counter 11 is subtracted at times $t_{n-1}$, $t_n$, and $t_{n+1}$ is 1/16 the count value at each time (defined as $t_{n-1}$, $t_n$, and $t_{n+1}$).

One counter of the acceleration detection circuit 16 counts 80 pulses during the time slot between times $t_{n-2}$ and $t_{n-1}$. The other counter thereof counts 81 pulses during the time slot between times $t_{n-1}$ and $t_n$. Therefore, the acceleration detection circuit 16 determines that the vehicle normally runs (without acceleration and deceleration) and changes the levels of the frequency division ratio control signals S1, S2, and S3 as follows: S1, S3=LOW LEVEL, S2=HIGH LEVEL. Thus, the switches SW1, SW2, and SW3 of the frequency division circuit 15 are operated to select the terminals A1 and A3 and the switch SW2 is operated to select the terminal B2. Hence, the frequency division ratio of the frequency divider 15 indicates 16. The preset value from the preset counter 14 is divided to 1/16 and the 1/16 preset value is outputted from the divider 15. Consequently, the up/down counter 11 substracts $C_n/16$ from the count value $C_n$ at the time $t_n$. The count value at the time $t_o$ indicates $(15/16)C_n$.

(3) Sudden Deceleration

In this case, the operation timing and contents of operation at each circuit are substantially the same as those in the cases of sudden acceleration and normal running of the vehicle. However, the value by which the output contents of the up/down counter 11 is subtracted is $\frac{1}{8}$.

One of the two counters in the acceleration detection circuit 16 counts 100 pulses during the time slot between times $t_{n-2}$ and $t_{n-1}$, while the other counts 80 pulses during the time slot between times $t_{n-1}$ and $t_n$. Therefore, the acceleration detection circuit 16 determines that the vehicle is suddenly (abruptly) decelerated and sets the frequency division ratio control signals S1, S2, and S3 as follows: S1, S2=LOW LEVEL, S3=HIGH LEVEL. Thus, the switches SW1 and SW2 of the frequency divider 15 are operated to select the terminals A1 and A2 and the switch SW3 is operated to select the terminal B3. Therefore, the frequency division ratio of the divider 15 indicates 8. The preset value from the preset counter 15 is frequency divided to $\frac{1}{8}$. Consequently, the up/down counter 11 substracts $C_n/8$ from the count value $C_n$ at the time $t_n$. The count value at the time $t_o$ indicates $(7/8)C_n$.

Hence, since the subtraction value which is large as compared with those in the cases of the sudden acceleration and normal running is subtracted from the previous count value, the effect of the previous count values on the present value is reduced and the vehicle speed can accurately be indicated.

The fourth preferred embodiment can also be applied to the pulse signal frequency measuring apparatus other than the speedometer. The setting values of the frequency division ratio are not limited as those described above. That is to say, three (sudden acceleration, normal running, and sudden deceleration) or more stages of ratios may be set.

In addition, the circuit construction of the fourth preferred embodiment is not limited to that shown in FIG. 15.

For example, a subtractor may be connected to the output terminal of the up/down counter 11 to subtract the same contents as described above at a predetermined period.

Since, in the fourth preferred embodiment, a value determined according to the magnitude of the rate of change in the measured pulse numbers for each time interval $\Delta T$ is used to subtract the count value of the counting means, the effect of the previous count values within the respective frequency measuring times during the sudden deceleration and acceleration of the vehicle on the present count value is remarkably suppressed. Consequently, the accuracy and responsiveness of the pulse signal frequency measuring apparatus can to remarkably improved.

The other effects in the fourth preferred embodiment are substantially the same as those described in the first, second, and third preferred embodiments.

It will fully be appreciated by those skilled in the art that the foregoing description has been made in terms of the preferred embodiments and various changes and modifications may be made without departing from the scope of the present invention which is to be defined by the appended claims.

What is claimed is:

1. An apparatus for measuring the frequency of a pulse train signal comprising:
   (a) first means for counting the number of pulses in a pulse train signal in each of a plurality of predetermined counting time intervals and outputting a count value representing the counted number of pulses whenever a predetermined counting time interval has elapsed;
   (b) second means for storing the count value outputted from the first means and for outputting the stored count value whenever a predetermined counting time interval has elapsed;
   (c) third means for controlling the first and the second means so that the second means outputs a sum of count values whenever the predetermined counting time interval has elapsed; and
   (d) fourth means for subtracting from the sum of count values at the present predetermined counting time interval a value generated during a transition time starting at the end of a previous predetermined counting time interval and ending at the start of a present predetermined counting time interval, whereby the second means outputs a count value corresponding to the frequency of the pulse train signal whenever the present predetermined time counting interval has elapsed.

2. The apparatus as recited in claim 1, wherein the fourth means subtracts from the sum a value $C/\alpha$ from the count value of the first means whenever the present predetermined counting interval has elapsed, wherein C is the count value from the previous predetermined counting time interval and $\alpha$ is a constant.

3. The apparatus as recited in claim 2, wherein $\alpha$ is $2^n$ and n is a natural number.

4. The apparatus as recited in claim 3, wherein the first means comprises an up/down counter for incrementally counting the number of pulses of the pulse train signal inputted at an up terminal thereof and for decrementally counting the number of pulses inputted at a down terminal thereof and the fourth means comprises: (a) a preset counter which is preset to the count value C whenever the start of the present predetermined counting time interval is reached; and (b) a frequency divider which receives the count value to which the preset counter is preset and outputs to the down terminal of the up/down counter the present count value multiplied by $\frac{1}{2^n}$, whereby the up/down counter counts $C-C/2^n$ and the second means outputs the stored count value of $C-C/2^n+D$, wherein D is the count value during the present counting time interval.

5. The apparatus as recited in claim 1, wherein the first means comprises a plurality m of up/down counters, count up terminals of the counters receiving the pulse train signal to be measured for counting up the up/down counters according to the number of pulses of the pulse train signal and count down terminals thereof receiving the pulse train signal for counting down the up/down counters according to the number of pulses of the pulse train signal, wherein the third means updates and restarts the respective up/down counters whenever the predetermined time counting interval has elapsed and the updating and restarting of the respective up/down counters are separated in time from each other by an interval equal to the predetermined counting time interval divided by a constant N.

6. The apparatus as recited in claim 5, wherein the fourth means subtracts a value $C \times m/\alpha$, from the stored count value of the second means whereby the third means updates counts in the m up/down counters to $C-C\times m/\alpha+D$, where C is the stored count value of the second means, D is the latest count value of the m up/down counters at the present predetermined counting time interval, and $\alpha$ is a constant.

7. The apparatus as recited in claim 6, wherein $\alpha=N$.

8. The apparatus as recited in claim 7, wherein $m=2$.

9. The apparatus as recited in claim 6, wherein the fourth means comprises: (a) a preset counter connected to the second means, wherein the preset count value of the preset counter is C; and (b) a frequency divider, connected to the preset counter, for outputting the pulse train signal represented by $C \times m/\alpha$ to the count down terminals of the up/down counters.

10. The apparatus as set forth in claim 1, wherein the first means comprises:
   (a) fifth means for counting the number of pulses of the pulse train signal for each predetermined counting time interval represented by $T/n$, wherein T is a frequency measuring interval of time controlling the resolution of the apparatus and n is a constant, the third means resetting and restarting counting by the fifth means whenever the predetermined counting time interval has elapsed; and (b) sixth means for counting the number of pulses counted by the fifth means, corresponding to the frequency of the pulse train signal to be measured, within a frequency measuring interval of time and outputting the count value C, and including seventh means for determining a magnitude of the rate of change of the count value of the fifth means with respect to time.

11. The apparatus as recited in claim 10, wherein the fourth means subtracts a value determined in response to the determination of the magnitude of the rate of change by the seventh means multiplied by a value determined in response to the output count C of the sixth means.

12. The apparatus as recited in claim 11, wherein the third means updates the count of the sixth means for each predetermined counting time interval to $C - M_1 C/\alpha + M_2 D$, wherein $\alpha$ is a constant, D is the count value of the fifth means at the time of the updating by the third means, and $M_1$ and $M_2$ are determined in response to the determination of the magnitude of the rate of change by the seventh means.

13. The apparatus as recited in claim 12, wherein the seventh means determines whether the rate of change of the count value of the fifth means exceeds a predetermined rate of change and wherein $M_1 = M_2 = 1$ when the seventh means determines that the rate of change of the count value of the fifth means is less than the predetermined rate of change.

14. The apparatus as recited in claim 12, wherein the seventh means determines whether the rate of change of the count value of the fifth means exceeds a predetermined rate of change and wherein $M_1 = M_2 = 2$ when the seventh means determines that the rate of change exceeds the predetermined rate of change.

15. The apparatus as recited in claim 12, wherein $M_1 \neq M_2$.

16. The apparatus as recited in claim 12, wherein $M_1 = M_2$.

17. The apparatus as recited in claim 12, wherein $\alpha = n$.

18. The apparatus as recited in claim 12, wherein the fifth means comprises a unidirectional counter, the sixth means comprises a data counter, and the seventh means comprises: a register connected to the unidirectional counter; and a comparator connected to the unidirectional counter and register.

19. The apparatus as recited in claim 18, wherein the fourth means comprises a multiplier for multiplying the count value of the unidirectional counter by $M_1$ or $M_2$, a second register connected to the data counter, and a frequency divider for dividing the output of the second register by $\alpha$, the output of the frequency divider being suppliable to the data counter via the multiplier whereby the data counter outputs a count of $C - M_1 \times C/\alpha + M_2 \times D$.

20. The apparatus as recited in claim 1 comprising fifth means for determining the magnitude of the rate of change in the count value of the first means with respect to time whenever the predetermined counting time interval has elapsed and wherein the fourth means subtracts a value determined in response to the determination of the rate of change by the fifth means from the count value of the first means and wherein the third means updates the count value of the first means to include the subtraction in the fourth means whenever the predetermined counting time interval has elapsed.

21. The apparatus as recited in claim 20, wherein the third means updates the count value of the first means as $C - C/M$, wherein C is the count value of the first means and M is the value determined by the fifth means.

22. The apparatus as recited in claim 20, wherein the fifth means comprises: (a) sixth means for counting the number of pulses in the pulse train signal to be measured for each predetermined counting time interval; (b) seventh means for storing the count value of the sixth means whenever the predetermined counting time interval has elapsed, the sixth means being reset when the seventh means has stored the count value of the sixth means; (c) eighth means for storing the count value of the sixth means counted after the sixth means is reset and for starting the counting of the number of pulses in the pulse train signal to be measured by the sixth means whenever the predetermined counting interval of time has elapsed; and (d) ninth means for comparing the stored count values of the seventh means and eighth means to determine the rate of change of the count value of the first means and for comparing the rate of change of the count value of the first means with at least one predetermined value.

23. The apparatus as recited in claim 22, wherein the ninth means compares the rate of change of the count value of the first means with a first predetermined value representing a reference acceleration and with a second predetermined value representing a reference deceleration to determine whether the rate of change of the count value of the first means exceeds the first predetermined value, is within the range between the first predetermined value and the second predetermined value, or is less than the second predetermined value.

24. The apparatus as recited in claim 23, wherein the fourth means comprises: (a) a preset counter connected to the first means and preset to the count value of the first means; (b) a frequency divider for dividing the preset value of the preset counter by a variable factor chosen in response to the rate of change determined by the ninth means and outputting the divided preset value to the first means and wherein the first means comprises an up/down counter for counting up the number of pulses in the pulse train signal to be measured inputted through an up terminal thereof and for counting down the number of pulses in a second pulse train signal inputted through a down terminal thereof, the second pulse train signal comprising the divided preset value.

25. The apparatus as recited in claim 24, wherein $M = 2^n$, wherein n is a variable that increases in response to the result of the comparison made by the ninth means.

26. The apparatus as recited in claim 25, wherein the frequency divider comprises a plurality of series connected flip-flop circuits, the variable factor being $\frac{1}{2}^5$ when the ninth means determines that the rate of change of the count value of the up/down counter exceeds the first predetermined value, $\frac{1}{2}^4$ when the ninth means determines that the rate of change of the count value of the up/down counter is within the range, and $\frac{1}{2}^3$ when the ninth means determines that the rate of change of the count value of the up/down counter is less than the second predetermined value.

27. The apparatus as recited in claim 1, comprising fifth means for detecting a vehicle speed and outputting the pulse train signal according to the detected vehicle speed and sixth means for receiving the outputted count value of the second means and for driving a speedometer of the vehicle upon receipt of the count value from the second means.

28. An apparatus for measuring the frequency of a pulse train signal comprising:
   (a) first means for counting the number of pulses in a pulse train signal in each of a plurality of predetermined counting time intervals of duration $\Delta T$ and outputting a count value C representing a counted number of pulses whenever a predetermined counting time interval has elapsed, the first means being updated and activated whenever the predetermined counting time interval T has elapsed so that the count value C outputting from said first means is the number of pulses counted within a predetermined frequency measuring interval of duration T;
   (b) second means for updating the count value C of the first means during a present predetermined counting time interval based on the count value of the first means during the previous predetermined counting time interval whenever the predetermined counting time interval $\Delta T$ has elapsed; and
   (c) third means for storing the count value C of the first means and outputting the stored count valued C of the first means whenever the predetermined counting interval of time $\Delta T$ has elapsed.

29. The apparatus as recited in claim 28, wherein the predetermined counting time interval $\Delta T$ is defined as $T/\alpha$, wherein $\alpha$ is a constant and wherein the second means updates the count value C of the first means to: $C-C/\alpha$.

30. The apparatus as recited in claim 29, wherein $\zeta=2^n$ and n is a natural number.

31. The apparatus as recited in claim 28, wherein the predetermined counting time interval is as T/N and N is a constant, wherein the first means comprises m counting means, each for counting the number of pulses of the pulse train signal to be measured, being reset and activated whenever a predetermined counting interval of time equal to $m \times T/N$ has elapsed, with a mutual separation in time of the reset timing of $\Delta T$, and wherein the second means updates the count data C of the first means in the third means to $C-C \times m/\alpha + D$, wherein $\alpha$ is a constant and D is the latest count values of the m counting means during the predetermined counting time interval $\Delta T$ at the most recent updating of the first means by the second means.

32. The apparatus as recited in claim 31, wherein the second means includes fourth means for presetting the count value of the first means whenever the predetermined counting time interval $\Delta T$ has elapsed and fifth means for multiplying the preset value of the fourth means by $m/\alpha$, the multiplying preset value being supplied to the m counting means.

33. The apparatus as recited in claim 32, wherein the m counting means comprise a plurality of up/down counters.

34. The apparatus as recited in claim 31, wherein $\alpha=n$.

35. The apparatus as recited in claim 28, wherein the first means comprises: (a) first counting means for counting the number of pulses in the pulse train signal to be measured within the predetermined counting time interval defined as T/n, wherein n is a natural number, the first counting means being reset and activated whenever the predetermined counting time interval has elapsed; (b) fourth means for determining the magnitude of the rate of change of the count value of the first counting means with respect to time; and (c) second counting means for counting the number of pulses which corresponds to the frequency of the pulse train signal to be measured within the frequency measuring time interval T and for outputting the count data C and wherein the second means updates the output count data C of the second counting means whenever the predetermined counting time interval T/n has elapsed to $C - M_1 \times C/\alpha + M_2 \times D$, wherein $\alpha$ is a constant, D is the count value of the first counting means at the time when the second means updates the output count data C of the second counting means, and M1 and M2 are values determined in response to the determination of the magnitude of the rate of change of the count value by fourth means.

36. The apparatus as recited in claim 35, wherein the fourth means compares the count value of the first counting means with a predetermined reference value and wherein $M_1 = M_2 = 1$ when the fourth means determines that the change rate of the count value of the counting means is less than the predetermined reference value.

37. The apparatus as recited in claim 36, wherein $\alpha = n$.

38. The apparatus as recited in claim 28, which further comprises fourth means for detecting the magnitude of the rate of change of the count value of the first means with respect to time and wherein the second means updates the count value C of the first means whenever the predetermined counting time interval $\Delta T$ has elapsed to $C-C/M$, wherein $\Delta T = T/N$, n is a natural number and M is a value determined in response to the determination by the fourth means of the magnitude of the rate of change of the count value.

39. The apparatus as recited in claim 38, wherein the value of M increases as the change of the rate of count value in the first means increases.

40. The apparatus as recited in claim 39, wherein the value of M increases stepwise as the rate of change of the count value in the first means increases.

41. The apparatus as recited in claim 39, wherein $M = 2^\alpha$, wherein $\alpha$ is a natural number that increases as the rate of change of the count value in the first means increases.

42. The apparatus as recited in claim 28, comprising fourth means for detecting a vehicle speed and outputting the pulse train signal representing the vehicle speed to the first means and fifth means for receiving the count value stored in the third means and for driving a speedometer of the vehicle in response to the stored value counted from the third means.

43. A method for measuring the frequency of a pulse train signal comprising:
   receiving a pulse train signal and counting the number of pulses of the receive pulse train signal for each predetermined counting time interval of duration $\Delta T$, wherein $\Delta T$ equals a frequency measuring time interval T for the pulse train signal divided by a constant n;
   updating a count value C to a value determined from a previous count value whenever $\Delta T$ has elapsed;
   receiving, storing, and outputting the stored count value C whenever $\Delta T$ has elapsed, the output count value C being a value corresponding to the frequency of the pulse train signal within the frequency measuring interval T;
   detecting a vehicle speed of a vehicle;
   generating and outputting the pulse train signal representing the detected vehicle speed; and
   receiving the output stored count value C and driving a speedometer of the vehicle with the output count value C.

* * * * *

UNITED STATES PATENT AND TRADEMARK OFFICE
CERTIFICATE OF CORRECTION

PATENT NO. : 4,953,095

DATED : August 28, 1990

INVENTOR(S) : Ishikawa et al.

It is certified that error appears in the above-identified patent and that said Letters Patent is hereby corrected as shown below:

On the title page:
In item [56] References Cited, line 8, change "11/1988" to --1/1988--.

Column 23, line 14, change "outputting" to --outputted--;
line 33, change "$\zeta$" to -- $\alpha$ --;

line 56, change "n" to --N--;
Column 24, line 33, change "change of the rate of" to --rate of change of the--.

Signed and Sealed this

Seventh Day of January, 1992

Attest:

HARRY F. MANBECK, JR.

*Attesting Officer*     *Commissioner of Patents and Trademarks*